United States Patent
Usami et al.

(10) Patent No.: US 11,069,655 B2
(45) Date of Patent: Jul. 20, 2021

(54) SEMICONDUCTOR DEVICE INCLUDING TWO OR MORE CHIPS MOUNTED OVER WIRING SUBSTRATE

(71) Applicant: Micron Technology, Inc., Boise, ID (US)

(72) Inventors: Sensho Usami, Akita (JP); Kazuhiko Shibata, Akita (JP); Yutaka Kagaya, Akita (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/816,949

(22) Filed: Nov. 17, 2017

(65) Prior Publication Data

US 2018/0076173 A1    Mar. 15, 2018

Related U.S. Application Data

(62) Division of application No. 14/519,753, filed on Oct. 21, 2014, now Pat. No. 9,837,377.

(30) Foreign Application Priority Data

Oct. 22, 2013 (JP) ................................. 2013-218905
May 29, 2014 (JP) ................................. 2014-111402

(51) Int. Cl.
*H01L 23/48* (2006.01)
*H01L 23/52* (2006.01)
(Continued)

(52) U.S. Cl.
CPC ............ *H01L 25/0652* (2013.01); *G11C 5/02* (2013.01); *H01L 23/49838* (2013.01);
(Continued)

(58) Field of Classification Search
CPC ....... G11C 5/02; H01L 23/49838; H01L 24/06; H01L 24/97; H01L 25/0657; H01L 25/0652; H01L 2224/97; H01L 2224/49171; H01L 2224/32145; H01L 2224/48228; H01L 2224/73265; H01L 2224/32225; H01L 2224/48227;
(Continued)

(56) References Cited

U.S. PATENT DOCUMENTS 6,388,318 B1    5/2002 Kagaya et al.
2004/0164385 A1*  8/2004 Kado .................. H01L 24/14
                                                        257/678
(Continued)

FOREIGN PATENT DOCUMENTS

JP    2000315776 A    11/2000
JP    2012230981 A    11/2012

*Primary Examiner* — Duy T Nguyen
*Assistant Examiner* — Dilinh P Nguyen
(74) *Attorney, Agent, or Firm* — Perkins Coie LLP

(57) ABSTRACT

A semiconductor device includes a composite chip mounted over a wiring substrate, the composite chip including a first area, a second area that is provided independently from the first area, and a third area including a first material between the first and second areas. The first area includes a first circuit formed in the first area, and the second area includes a second circuit formed in the second area. The first area is spaced apart from the second area by the first material.

13 Claims, 21 Drawing Sheets

(51) Int. Cl.
*H01L 29/40* (2006.01)
*H01L 23/02* (2006.01)
*H01L 25/065* (2006.01)
*H01L 23/00* (2006.01)
*G11C 5/02* (2006.01)
*H01L 23/498* (2006.01)
*H01L 23/31* (2006.01)
*H01L 21/56* (2006.01)

(52) U.S. Cl.
CPC .............. *H01L 24/06* (2013.01); *H01L 24/97* (2013.01); *H01L 25/0657* (2013.01); *H01L 21/561* (2013.01); *H01L 23/3128* (2013.01); *H01L 23/49811* (2013.01); *H01L 23/49827* (2013.01); *H01L 23/49894* (2013.01); *H01L 23/562* (2013.01); *H01L 24/05* (2013.01); *H01L 24/48* (2013.01); *H01L 2224/02375* (2013.01); *H01L 2224/0401* (2013.01); *H01L 2224/04042* (2013.01); *H01L 2224/05567* (2013.01); *H01L 2224/06155* (2013.01); *H01L 2224/131* (2013.01); *H01L 2224/13082* (2013.01); *H01L 2224/16238* (2013.01); *H01L 2224/2919* (2013.01); *H01L 2224/32145* (2013.01); *H01L 2224/32225* (2013.01); *H01L 2224/48227* (2013.01); *H01L 2224/48228* (2013.01); *H01L 2224/49171* (2013.01); *H01L 2224/49175* (2013.01); *H01L 2224/49177* (2013.01); *H01L 2224/73204* (2013.01); *H01L 2224/73265* (2013.01); *H01L 2224/96* (2013.01); *H01L 2224/97* (2013.01); *H01L 2225/0651* (2013.01); *H01L 2225/06565* (2013.01); *H01L 2924/1436* (2013.01); *H01L 2924/15183* (2013.01); *H01L 2924/15311* (2013.01); *H01L 2924/181* (2013.01)

(58) Field of Classification Search
CPC . H01L 2924/15311; H01L 2924/15183; H01L 2225/0651; H01L 2225/06517; H01L 2225/06513; H01L 2924/1436; H01L 2225/06506
USPC .......................................... 257/737, 686, 777
See application file for complete search history.

(56) References Cited

U.S. PATENT DOCUMENTS

| | | | |
|---|---|---|---|
| 2009/0194850 A1 | 8/2009 | Kaltalioglu et al. | |
| 2009/0212425 A1* | 8/2009 | Ito | H01L 22/32 |
| | | | 257/737 |
| 2011/0156232 A1* | 6/2011 | Youn | G11C 5/02 |
| | | | 257/686 |
| 2011/0287607 A1 | 11/2011 | Osako et al. | |
| 2012/0273971 A1 | 11/2012 | Usami et al. | |
| 2013/0280826 A1* | 10/2013 | Scanlan | H01L 23/544 |
| | | | 438/15 |
| 2015/0069576 A1* | 3/2015 | Mariani | H01L 21/78 |
| | | | 257/618 |

* cited by examiner

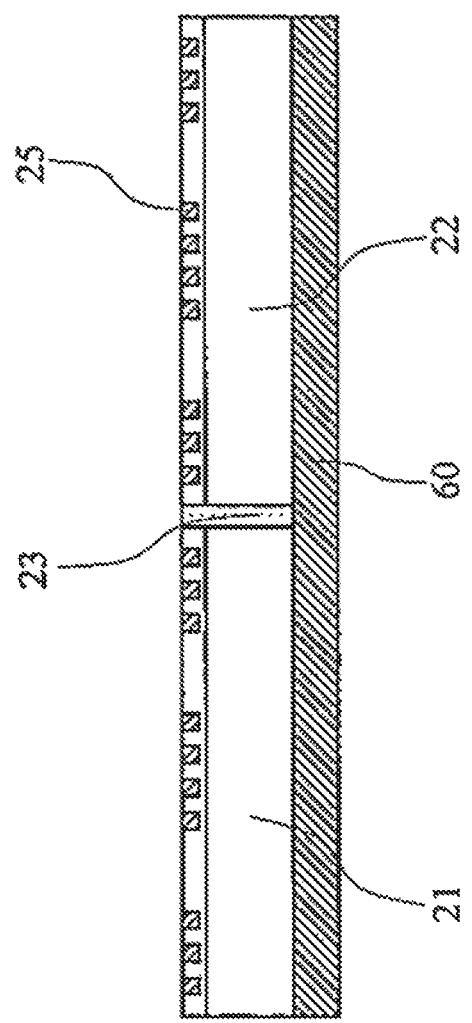

SEMICONDUCTOR DEVICE INCLUDING TWO OR MORE CHIPS MOUNTED OVER WIRING SUBSTRATE

CROSS-REFERENCE TO RELATED APPLICATIONS

This application is a divisional of U.S. application Ser. No. 14/519,753 filed Oct. 21, 2014, now U.S. Pat. No. 9,837,377, which is based upon and claims the benefit of priority from Japanese Patent Application No. 2013-218905, filed on Oct. 22, 2013, and Japanese Patent Application No. 2014-111402, filed on May 29, 2014, the disclosures of which are incorporated herein in their entirety by reference.

TECHNICAL FIELD

The present invention relates to a semiconductor device, and more particularly to such a device having two or more semiconductor chips mounted over a wiring substrate. The present invention may also relate to a method of manufacturing such a device.

BACKGROUND

In recent years, with reduction in size and thickness of portable devices and others having semiconductor devices mounted thereon, demands for reducing the size and thickness of the semiconductor devices have been increasing.

Japanese Patent Application Laid-Open No. 2000-315776 discloses a semiconductor device configured to have a plurality of semiconductor chips mounted into one package to support large capacity.

Japanese Patent Application Laid-Open No. 2012-230981 discloses a semiconductor device having at least two semiconductor chips mounted thereon and effective in reducing the amount of warpage occurring between the semiconductor chips and stabilizing a warpage shape.

When a plurality of semiconductor chips are mounted so as to be arranged in parallel on a wiring substrate and have resin casted therein, it is required to determine a space between semiconductor chips in consideration of filling ability of sealing resin so as to also fill between the semiconductor chips with resin. Thus, in a general semiconductor device manufacturing method, a certain space, for example, a space on the order of 0.2 mm, is required on the wiring substrate, and reduction in size of the wiring substrate has a limitation. Moreover, in the general semiconductor device manufacturing method, a plurality of semiconductor chips is mounted one by one over the wiring substrate, and therefore the number of processes increases accordingly, thereby posing a problem of inefficiency at the time of manufacture.

However, these problems are not considered in the above-described Japanese Patent Application Laid-Open No. 2000-315776 and Japanese Patent Application Laid-Open No. 2012-230981. For example, while Japanese Patent Application Laid-Open No. 2012-230981 points out that a two-bump-shaped recessed warpage occurs when two semiconductor chips are arranged with a space of 2.5 mm, a reduction in size of a wiring substrate, an improvement in manufacturing efficiency, and so forth are not considered.

Therefore, the emergence of a semiconductor device supporting reduction in size and thickness and having high manufacturing efficiency is desired.

SUMMARY

In one embodiment, there is provided a semiconductor device comprising: a wiring substrate; and a first single semiconductor substrate mounted over the wiring substrate, the first single semiconductor substrate comprising a first circuit formation area and a second circuit formation area that is provided independently from the first circuit formation area, the first circuit formation area comprising a plurality of first circuit blocks and a plurality of first electrode pads that are disposed in a first layout, the second circuit formation area comprising a plurality of second circuit blocks and a plurality of second electrode pads that are disposed in a second layout, and the first layout being identical to the second layout.

In another embodiment, there is provided a semiconductor device comprising: a wiring substrate; and a first composite chip mounted over the wiring substrate, the first composite chip including a first area, a second area and a third area that is sandwiched between the first and second areas, the first composite chip further including a first memory circuit formed in the first area and a second memory circuit formed in the second area, the first and second memory circuits being substantially free from electrically connecting to each other via the third area.

In still another embodiment, there is provided a semiconductor device comprising: a composite chip including a first area, a second area and a third area that is sandwiched between the first and second areas, the composite chip further including a first memory circuit formed in the first area, a plurality of first electrode pads that are coupled to the first memory circuit, a second memory circuit formed in the second area, a plurality of second electrode pads that are coupled to the second memory circuit and a protective layer selectively formed over the first and second areas so as to expose the first and second electrode pads; a plurality of first rewiring pads formed over the protective layer in the first area, each of the first rewiring pads being coupled to an associated one of the first electrode pads; and a plurality of second rewiring pads formed over the protective layer in the second area, each of the rewiring pads being coupled to an associated one of the second electrode pads.

BRIEF DESCRIPTION OF THE DRAWINGS

The above features and advantages of the present invention will be more apparent from the following description of certain preferred embodiments taken in conjunction with the accompanying drawings, in which:

FIG. 6B is an E-E' sectional view of FIG. 6A;

DETAILED DESCRIPTION

This invention will be described herein with reference to illustrative embodiments. Those skilled in the art will recognize that many alternative embodiments can be accomplished using the teachings of the present invention and that the invention is not limited to the embodiments illustrated for explanatory purposes.

The embodiments for carrying out the present invention are described in detail with reference to the drawings. Also, while a composite chip having two semiconductor chips connected to each other is described below as an example, this does not restrict the number of semiconductor chips to be mounted over the semiconductor device of the present invention.

First Embodiment

Figure 1:
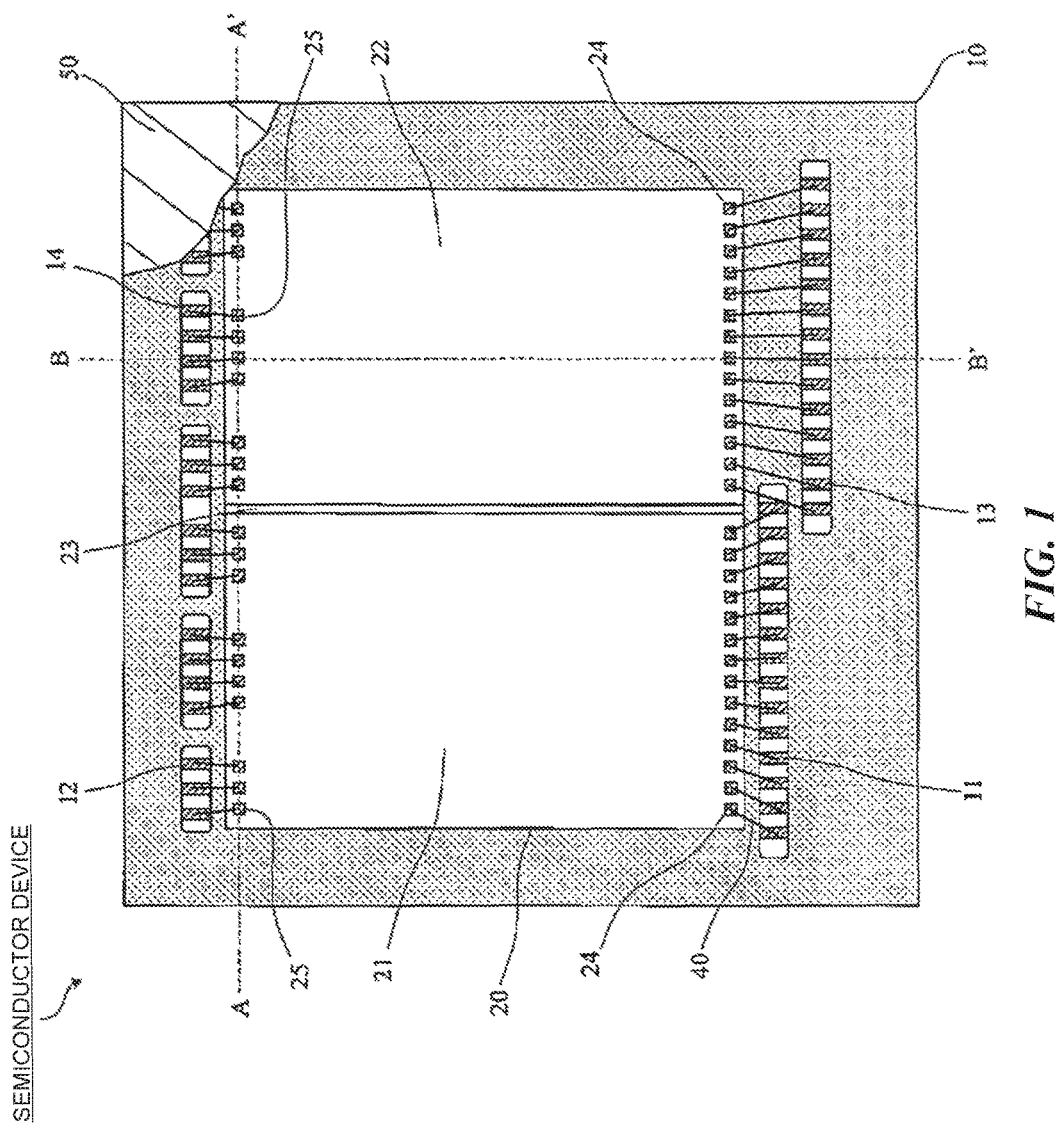
FIG. 1 is a plan view depicting the structure of a semiconductor device of a first embodiment according to the present invention.
Figure 2A:
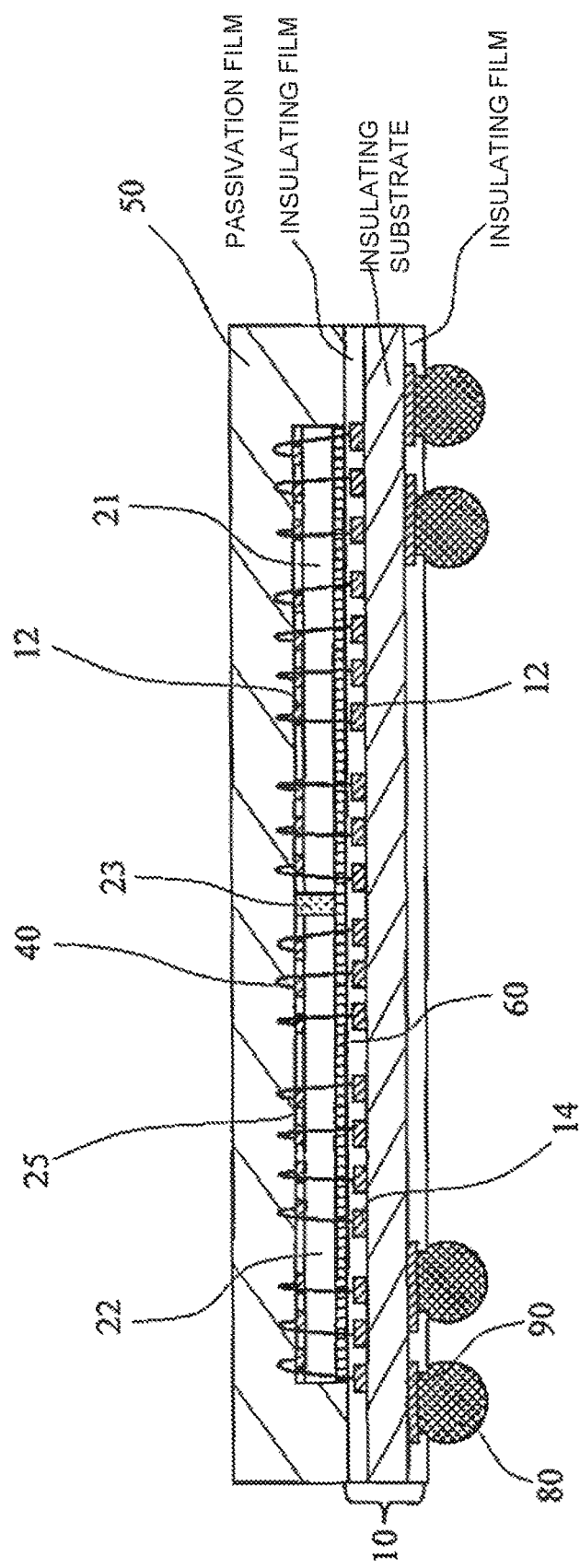
FIG. 2A is an A-A' sectional view of FIG. 1 depicting the structure of the semiconductor device of the first embodiment according to the present invention.
Figure 2B:
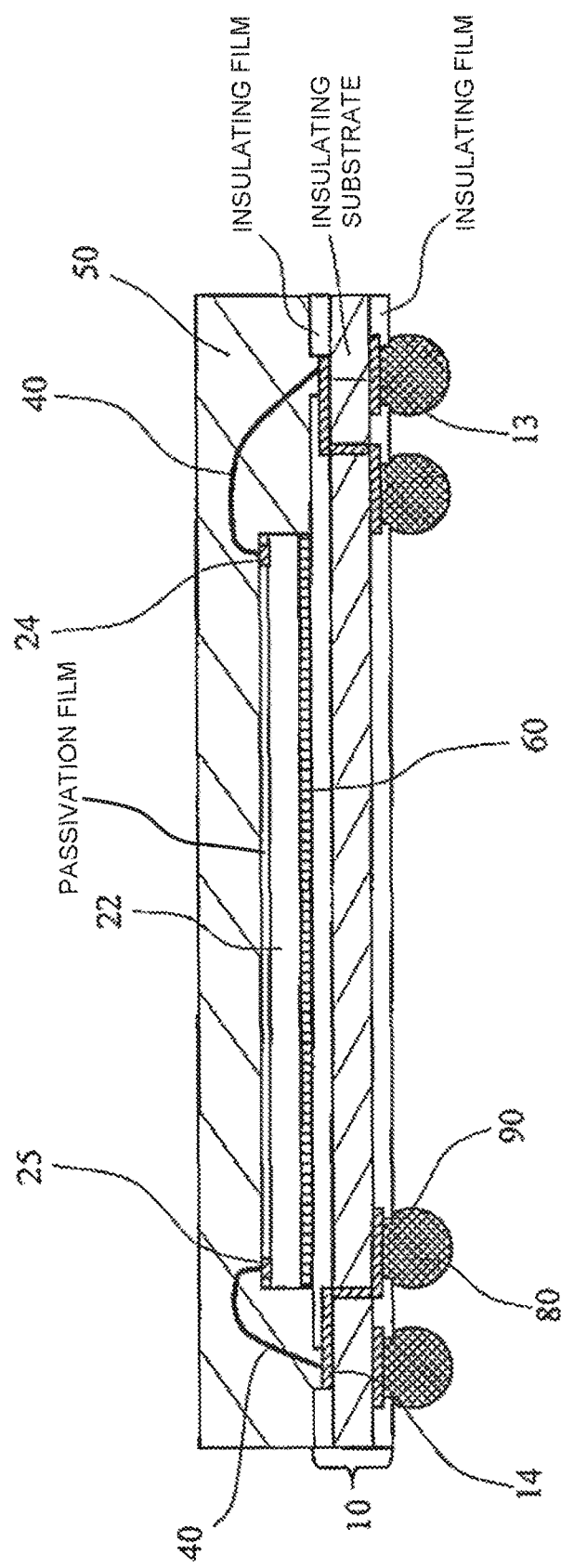
FIG. 2B is a B-B' sectional view of FIG. 1 depicting the structure of the semiconductor device of the first embodiment according to the present invention.

FIG. 1 is a plan view depicting the structure of a semiconductor device of a first embodiment according to the present invention. FIG. 2A is an A-A' sectional view of the semiconductor device depicted in FIG. 1, and FIG. 2B is a B-B' sectional view of the semiconductor device depicted in FIG. 1. In the following, the structure of the semiconductor device of the first embodiment is described with reference to FIG. 1, FIG. 2A, and FIG. 2B as appropriate.

With reference to FIG. 1, the semiconductor device of the first embodiment according to the present invention includes a wiring substrate 10 and a first composite chip 20. The wiring substrate 10 and the first composite chip 20 are wire-bonded by conductive wires 40. Furthermore, the semiconductor device of the first embodiment is configured to have the wiring substrate 10, the first composite chip 20, and the wires 40 covered with a sealing resin layer 50.

The wiring substrate 10 includes, on its one surface, a plurality of first connection pads 11, a plurality of second connection pads 12, a plurality of third connection pads 13, and a plurality of fourth connection pads 14 exposed from openings of an insulating film. With reference to FIG. 2, the wiring substrate 10 is configured of, for example, an insulating base material with both surfaces each covered with an insulating film, for example, a solder resist film. Also, the wiring substrate 10 includes, on a surface opposite to the surface including the first connection pads 11 and others, lands 90 where solder balls 80 are mounted.

The first composite chips 20 are configured to have a long side of a first semiconductor chip 21 and a long side of a second semiconductor chip 22 mechanically-connected to each other by a dicing area 23. Since the dicing area 23 does not include wiring, the first semiconductor chip 21 and the second semiconductor chip 22 are not electrically connected to each other. The first composite chip 20 is mounted over the wiring substrate 10 by a first adhesive member 60, for example, a DAF (Die Attach Film). Here, the first composite chip 20 according to the present invention is not restricted to the example in which the long sides of two semiconductor chips are connected to each other. The first composite chip 20 may be configured to have two or more semiconductor chips connected to each other by a dicing area, or to have short sides of the semiconductor chips connected to each other by a dicing area, for example.

The dicing area 23 has a width on the order of 20 μm to 80 μm. On the other hand, when a plurality of semiconductor chips are individually mounted over the wiring substrate, a clearance between semiconductor chips is required to be at least on the order of 200 μm. Therefore, the first composite chip 20 according to the present invention having the first semiconductor chip 21 and the second semiconductor chip 22 connected to each other by the dicing area 23 can configure the small wiring substrate 10 compared with the case in which semiconductor chips are individually mounted over the wiring substrate. That is, since the size of the wiring substrate 10 can be reduced, the size of the semiconductor device of the first embodiment according to the present invention can be reduced.

Also, the first semiconductor chip 21 and the second semiconductor chip 22 each include, on one surface, a plurality of first electrode pads 24 along one short side and a plurality of second electrode pads 25 along the other short side. The first and second electrode pads of the second semiconductor chip are arranged in a same layout as the first and second electrode pads of the first semiconductor chip. Here, the number of second electrode pads 25 included in each of the first semiconductor chip 21 and the second semiconductor chip 22 is more than the number of first electrode pads 24.

Furthermore, on the front surface of each of the first semiconductor chip 21 and the second semiconductor chip 22, a passivation film (protective layer) is formed to protect a circuit formation surface so that the first electrode pads 24 and the second electrode pads 25 are exposed.

The first connection pads 11 and the first electrode pads 24 included in the first semiconductor chip 21 are wire-bonded by the conductive wires 40. The second connection pads 12 and the second electrode pads 25 included in the first semiconductor chip 21 are wire-bonded by the conductive wires 40. With this, the wiring substrate 10 and the first semiconductor chip 21 are electrically connected to each other.

Similarly, the third connection pads 13 and the first electrode pads 24 included in the second semiconductor chip 22 are wire-bonded by the conductive wires 40. The fourth connection pads 14 and the second electrode pads 25 included in the second semiconductor chip 22 are wire-bonded by the conductive wires 40. With this, the wiring substrate 10 and the second semiconductor chip 22 are electrically connected to each other.

Note that the third connection pads 13 are arranged at positions where a distance from the third connection pads 13 to the first electrode pads 24 included in the second semiconductor chip 22 is longer than a distance from the first connection pads 11 to the first electrode pads 24 included in the first semiconductor chip 21. By ensuring a space on a short side with a larger number of electrode pads, the risk of a short circuit when the wires 40 are stretched can be reduced.

Also, the first composite chip 20 is mounted so that a space on the short side including the first electrode pads 24 over the wiring substrate 10 is wider than a space on the short side including the second electrode pads 25. By widening the space on the first electrode pad 24 side with more pads, wire routing can be easily made.

Here, the structure of the composite chip according to the present invention is described.

Figure 3:
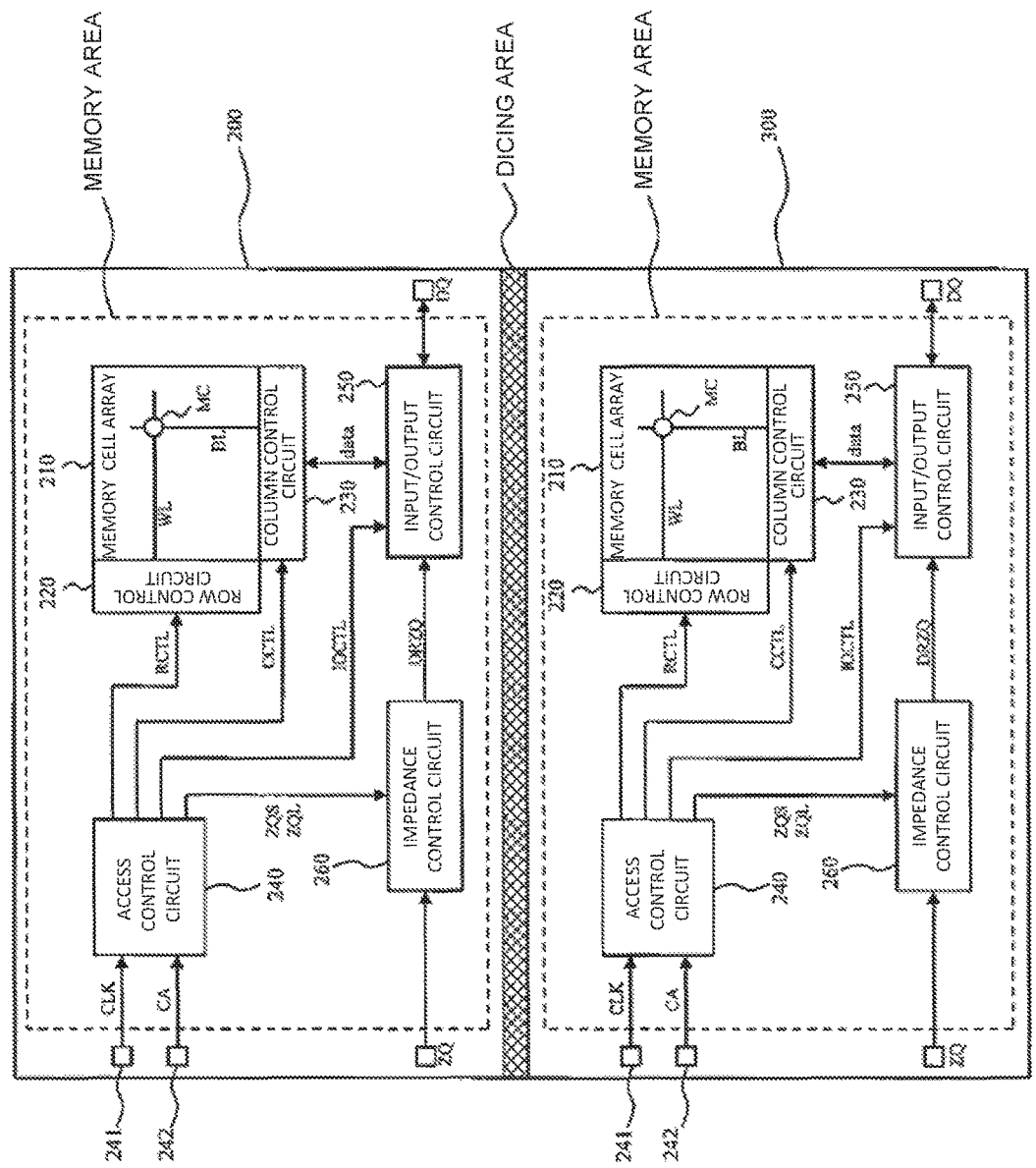
FIG. 3 is a block diagram depicting the structure of a composite chip according the present invention.

FIG. 3 is a block diagram depicting an example of the structure of the composite chip according to the present invention. In the following, the example of the composite chip according to the present invention is described in detail with reference to FIG. 3 as appropriate.

The composite chip according to the present invention is, for example, a composite chip comprising a single semiconductor substrate that is connected two semiconductor chips by a dicing area. The semiconductor chips each having a DRAM (Dynamic Random Access Memory) circuit formed thereon. With reference to FIG. 3, the composite chip has a first memory chip 200 and a second memory chip 300 connected to each other by a dicing area. The first memory chip 200 and the second memory chip 300 each have a similar memory circuit area (a circuit formation area) which functions independently. Thus, in the following, the first memory chip 200 is described as an example.

The first memory chip 200 includes a plurality of circuit blocks, for example, a memory cell array 210, a row control circuit 220, a column control circuit 230, an access control circuit 240, an input/output control circuit 250, and an impedance control circuit 260.

The memory cell array 210 includes a plurality of word lines WL and a plurality of bit lines BL. Also, a memory cell MC is arranged at each of points of intersection of the word lines WL and the bit lines BL. The type of memory for use as the memory cell MC is not particularly restrictive. As the memory cell MC, for example, a DRAM cell, a flash memory cell, a ReRAM (Resistance Random Access Memory) cell, or the like can be used.

The row control circuit 220 selects a word line WL. The column control circuit 230 selects a bit line BL. The access control circuit 240 controls operations of the row control circuit 220 and the column control circuit 230.

The access control circuit 240 includes an internal clock generating circuit, a command decoder, an address buffer, a mode register, and others. To the access control circuit 240, a clock signal CLK is externally inputted via a clock terminal 241. Also, to the access control circuit 240, a command address signal CA is externally inputted via a command address terminal 242. Based on the clock signal CLK and the command address signal CA, the access control circuit 240 generates various control signals such as, for example, a row control signal RCTL and a column control signal CCTL.

For example, when the command address signal CA accesses a row address, the access control circuit 240 outputs a row control signal RCTL to the row control circuit 220. In this case, the row control circuit 220 selects a word line WL corresponding to the row control signal RCTL. The row control signal RCTL includes a row address, a sense amplifier enable signal, and others.

Also, for example, when the command address signal CA accesses a column address, the access control circuit 240 outputs a column control signal CCTL to the column control circuit 230. In this case, the column control circuit 230 selects a bit line BL corresponding to the column control signal CCTL. The column control signal CCTL includes a column address, a column switch timing signal, and others. Furthermore, the access control circuit 240 outputs an input/output control signal IOCTL to the input/output control circuit 250 at the time of accessing the column address. The input/output control signal IOCTL is a signal for controlling an input/output operation for data data, and includes, for example, an input/output timing signal, a driver strength signal, and others.

The input/output control circuit 250 reads data data from the memory cell array 210 at the time of read operation, and outputs the read data data from a data output terminal DQ to outside. Also, at the time of write operation, the input/output control circuit 250 writes data data inputted from outside to the data input terminal DQ into the memory cell array 210.

The access control circuit 240 outputs a code latch signal ZQL to the impedance control circuit 260 when the command address signal CA indicates a first impedance adjustment command. Also, when the command address signal CA indicates a second impedance adjustment command, the access control circuit 240 outputs an impedance adjustment start signal ZQS to the impedance control circuit 260.

When receiving a first impedance adjustment command, the access control circuit 240 can output the code latch signal ZQL both at the time of read operation and at the time of write operation. By contrast, when receiving a second impedance adjustment command, the access control circuit 240 cannot output the impedance adjustment start signal ZQS at the time of read operation and at the time of write operation.

The impedance control circuit 260 generates an impedance adjustment signal DRZQ according to the impedance adjustment command. Also, the impedance control circuit 260 outputs the generated impedance adjustment signal DRZQ to the input/output control circuit 250.

The output impedance of the input/output control circuit 250 is adjusted based on the impedance adjustment signal DRZQ.

Next, with reference to FIG. 4 as appropriate, a semiconductor wafer for fabricating semiconductor chips according to the present invention is described in detail.

Figure 4A:
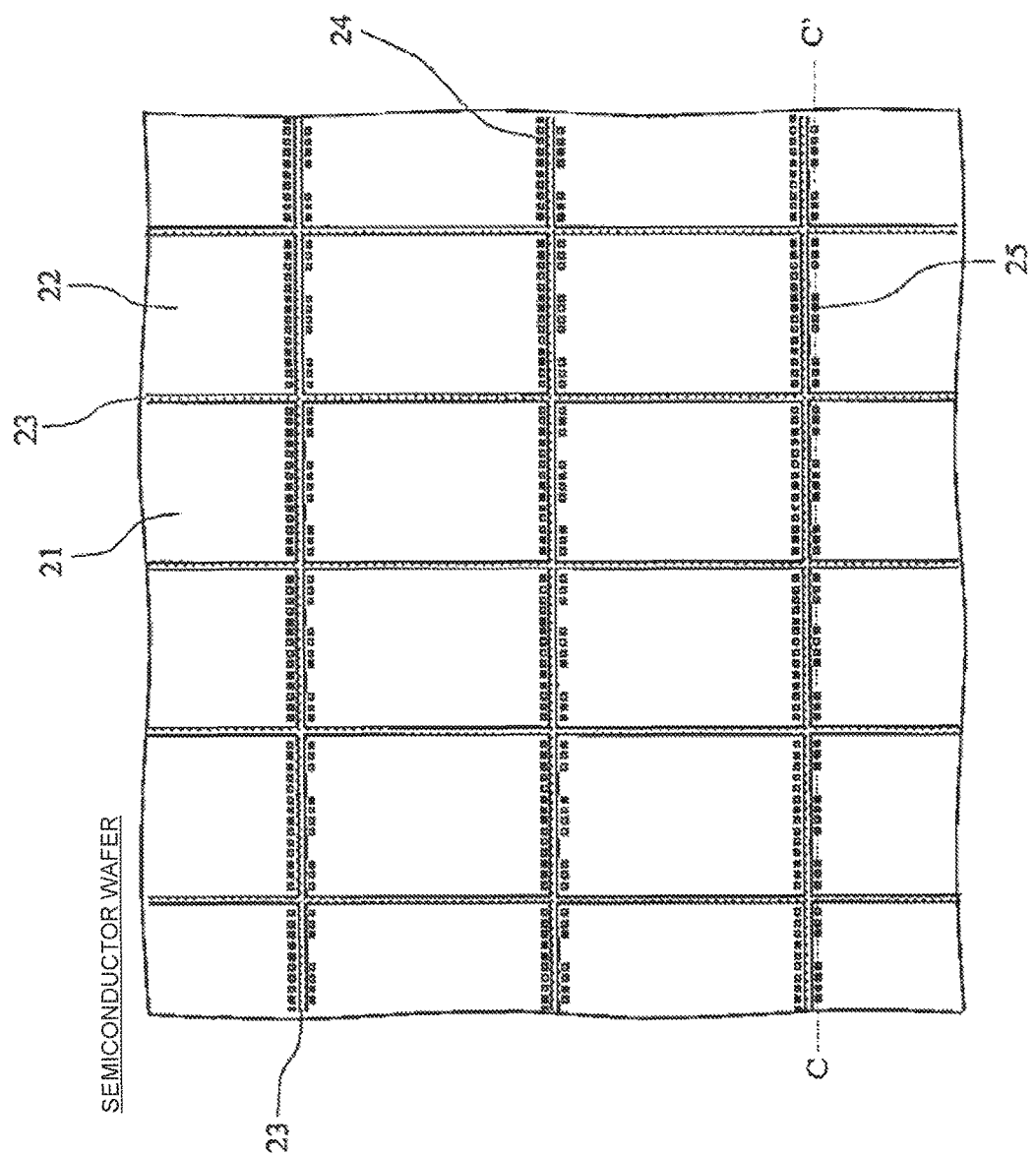
FIG. 4A is a plan view depicting the semiconductor wafer according to the present invention.
Figure 4B:
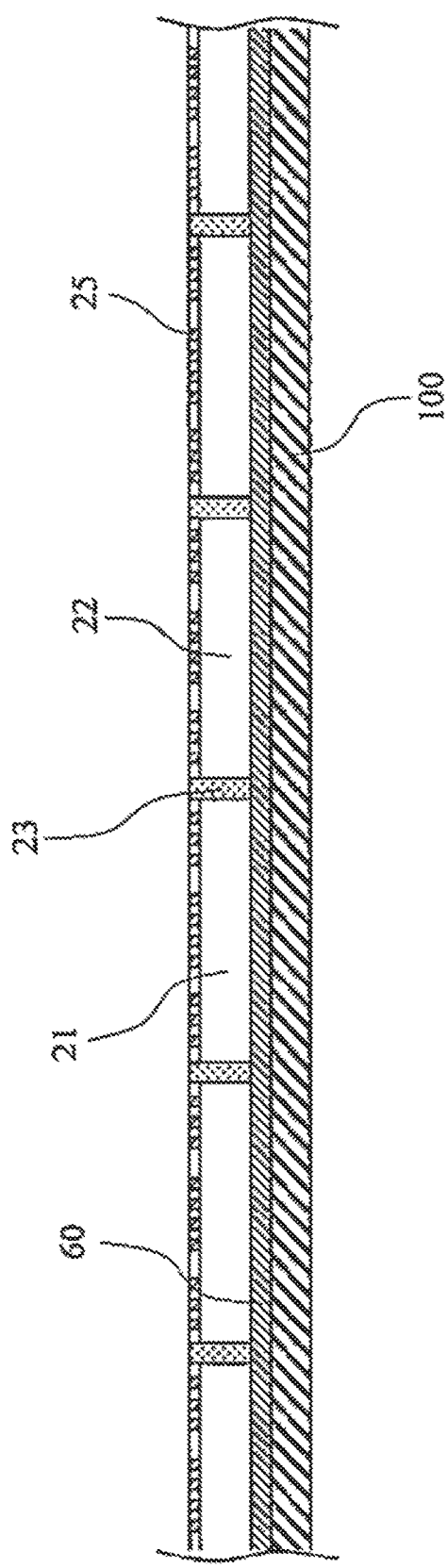
FIG. 4B is a C-C' sectional view of FIG. 4A.

FIG. 4A is a plan view depicting part of a semiconductor wafer, and FIG. 4B is a C-C' sectional view of the semiconductor wafer depicted in FIG. 4A.

With reference to FIG. 4A, a plurality of semiconductor chips configuring a semiconductor wafer are sectioned by the dicing areas 23. With reference to FIG. 4B, the semiconductor wafer is held on a dicing tape 100 via the first adhesive member 60, for example, a DAF.

Next, with reference to FIG. 5 as appropriate, a dicing process according to the present invention is described in detail.

Figure 5A:
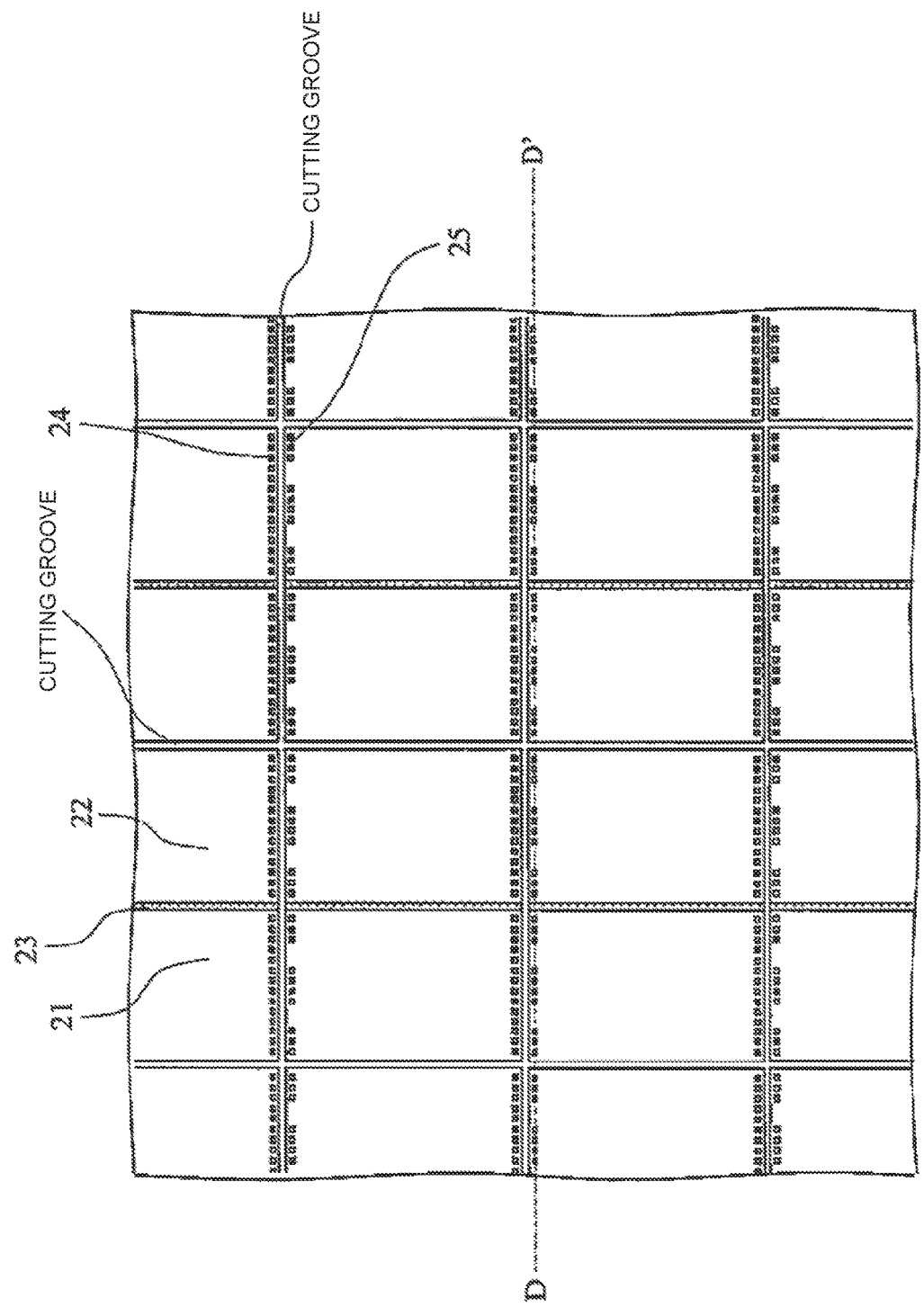
FIG. 5A is a plan view depicting a process of dicing the semiconductor wafer according to the present invention.
Figure 5B:
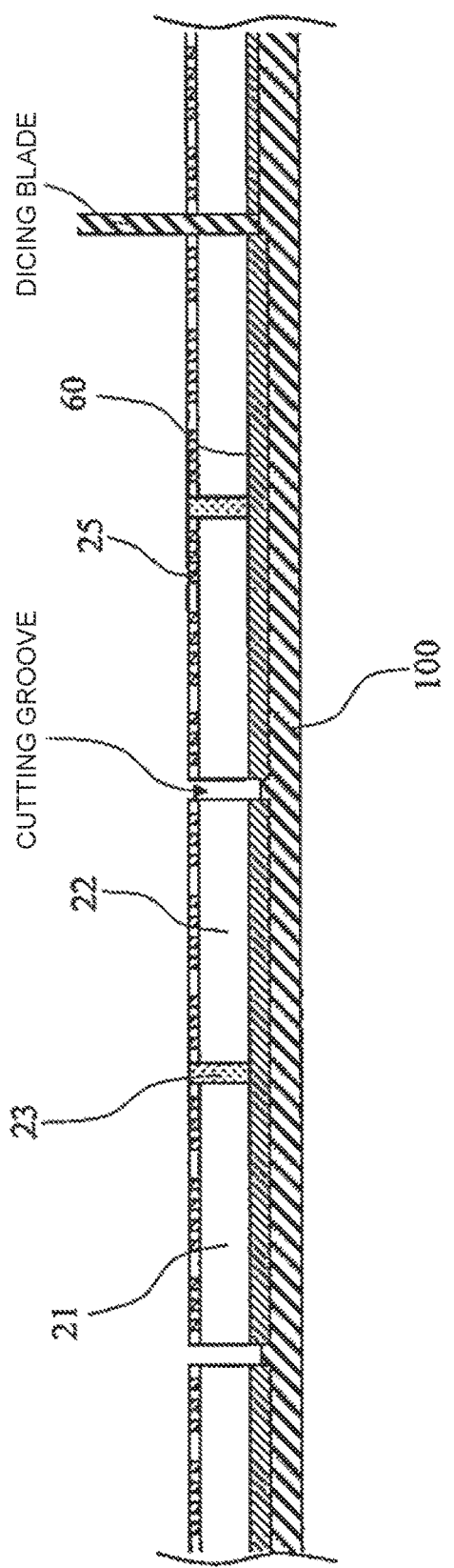
FIG. 5B is a D-D' sectional view of FIG. 5A.

FIG. 5A is a plan view depicting dicing of the semiconductor wafer according to the present invention, and FIG. 5B is a D-D' sectional view of the semiconductor wafer depicted in FIG. 5A.

The semiconductor wafer is cut by, for example, a dicing blade. The first composite chip 20 can be formed by cutting the semiconductor wafer for every two semiconductor chips adjacent to each other in a long side direction, that is, cutting every other dicing areas 23 in the long side direction. The first composite chip comprising the single semiconductor substrate on which two semiconductor chips are connected by the dicing area is obtained.

Here, the dicing areas 23 to be cut can be arbitrarily changed. For example, by cutting every other dicing areas in the long side direction and the short side direction, a composition chip having four semiconductor chips connected to each other can be formed. Therefore, in the present invention, a composite chip can be formed only by cutting the semiconductor wafer without adding a new process.

Figure 6A:
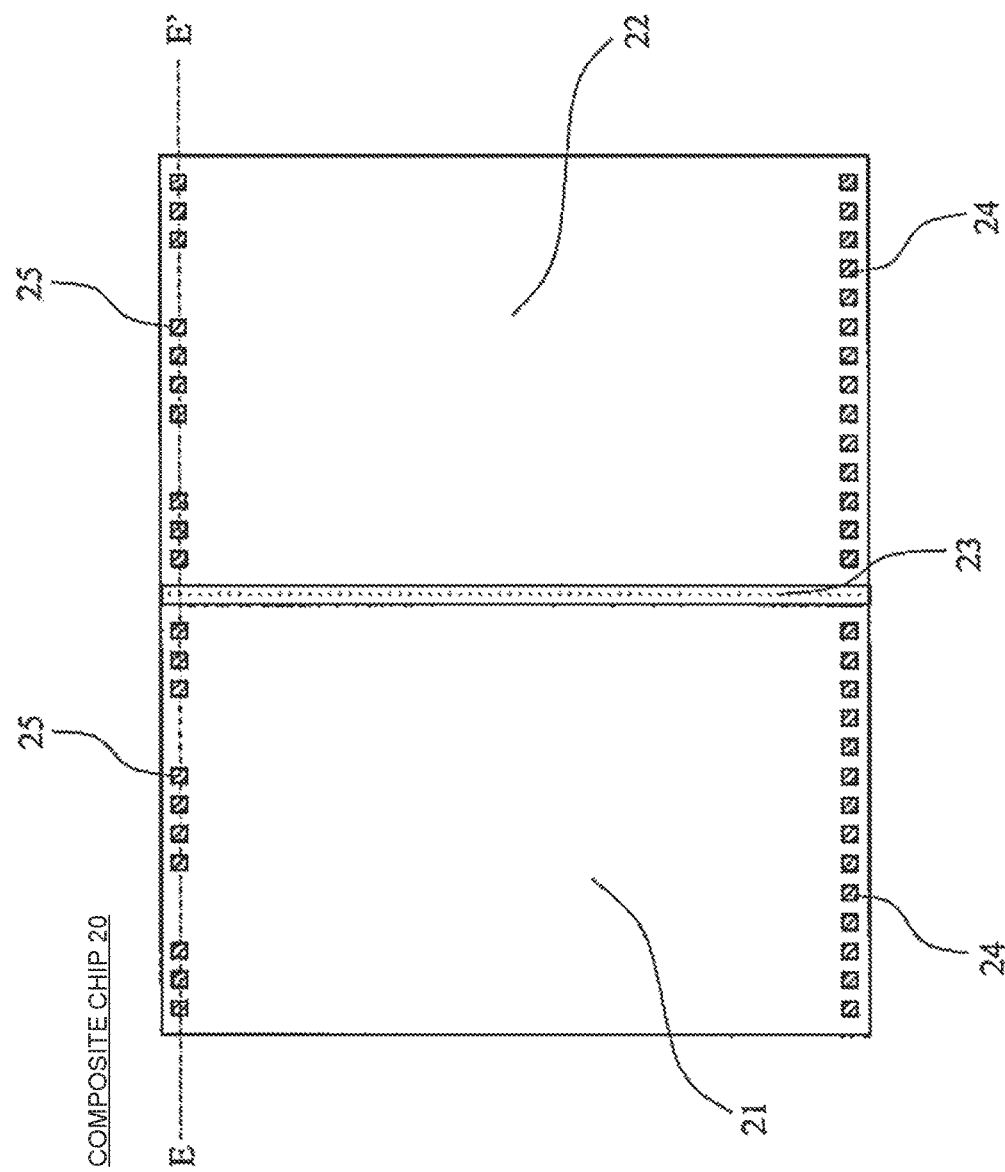
FIG. 6A is a plan view depicting a first semiconductor chip and a second semiconductor chip connected by a dicing area.

FIG. 6A is a plan view of a first composite chip 20 obtained by cutting the semiconductor wafer depicted in FIG. 4 and FIG. 5 by the dicing areas 23. FIG. 6B is an E-E' sectional view of the first composite chip depicted in FIG. 6A.

With reference to FIG. 6B, the first composite chip 20 includes the first adhesive member 60 on a surface opposite to the surface where the first electrode pads 24 and the second electrode pads 25 are provided.

FIG. 7A to FIG. 7F are sectional views depicting a flow of assembling the semiconductor device of the first embodiment according to the present invention. In the following, with reference to FIG. 7A to FIG. 7F as appropriate, the assembling flow of the first embodiment of the semiconductor device according to the present invention is described in detail.

Figure 7A:
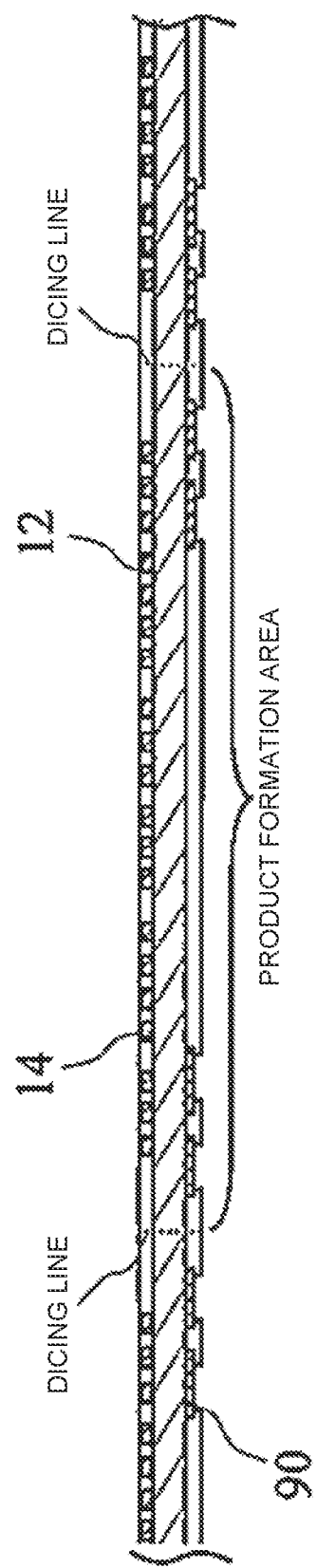
FIG. 7A to FIG. 7F are sectional views depicting a flow of assembling the semiconductor device of the first embodiment according to the present invention.

FIG. 7A depicts the wiring substrate 10. The wiring substrate 10 is configured to have both surfaces of an insulating base material each covered with an insulating film. The wiring substrate 10 includes the first connection pads 11 to the fourth connection pads 14 on one surface and includes the plurality of lands 90 on the other surface. Also, the wiring substrate 10 is sectioned by dicing lines, and is cut along the dicing lines after completion of assembling.

Figure 7B:
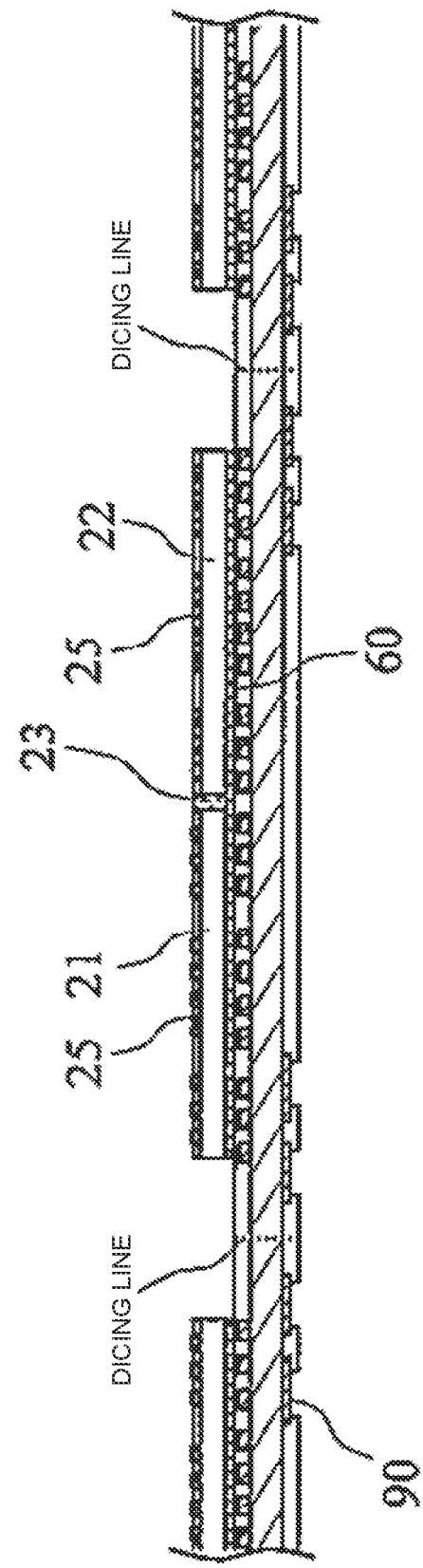

FIG. 7B depicts a process of mounting the first composite chip 20 over the wiring substrate 10. In this process, the first composite chip 20 is mounted over a product formation area of the wiring substrate 10 via the first adhesive member 60. As the first adhesive member 60, for example, a DAF can be used. Also, the first composite chip 20 is configured to have the first semiconductor chip 21 and the second semiconductor chip 22 mechanically-connected to each other by the dicing area 23.

Figure 7C:
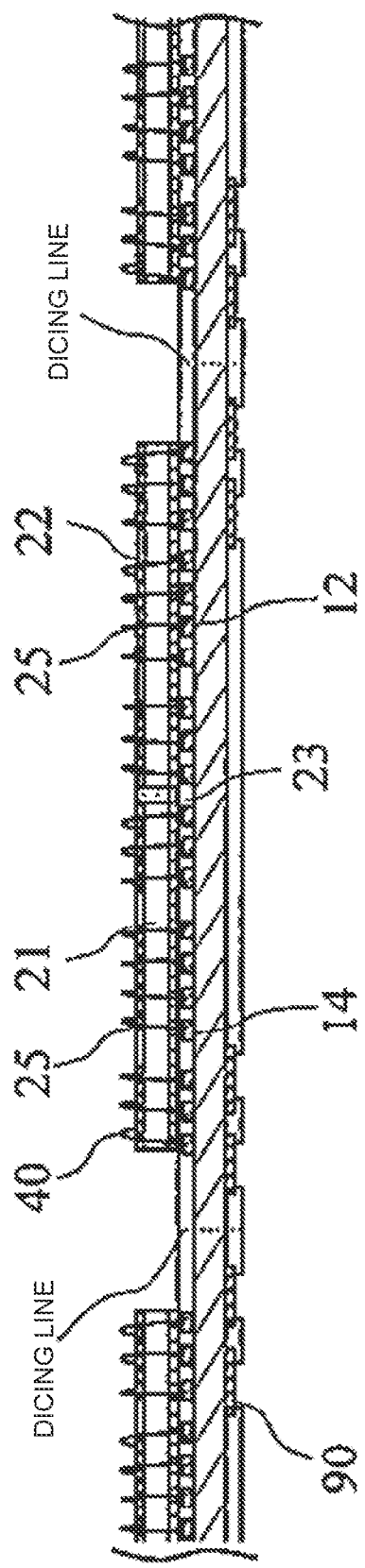

FIG. 7C depicts a process of wire-bonding the wiring substrate 10 and the first composite chip 20 via the conductive wires 40. In this process, the second connection pads 12 are wire-bonded to the second electrode pads 25 included in the first semiconductor chip 21. Also, although not depicted, the first connection pads 11 are wire-bonded to the first electrode pads 24 included in the first semiconductor chip 21.

Similarly, the fourth connection pads 14 are wire-bonded to the second electrode pads 25 of the second semiconductor chip 22. Also, although not depicted, the third connection pads 13 are wire-bonded to the first electrode pads 24 included in the second semiconductor chip 22.

By wire-bonding each connection pads and each electrode pads as described above, the wiring substrate 10 and the first composite chip 20 are electrically connected to each other.

Figure 7D:
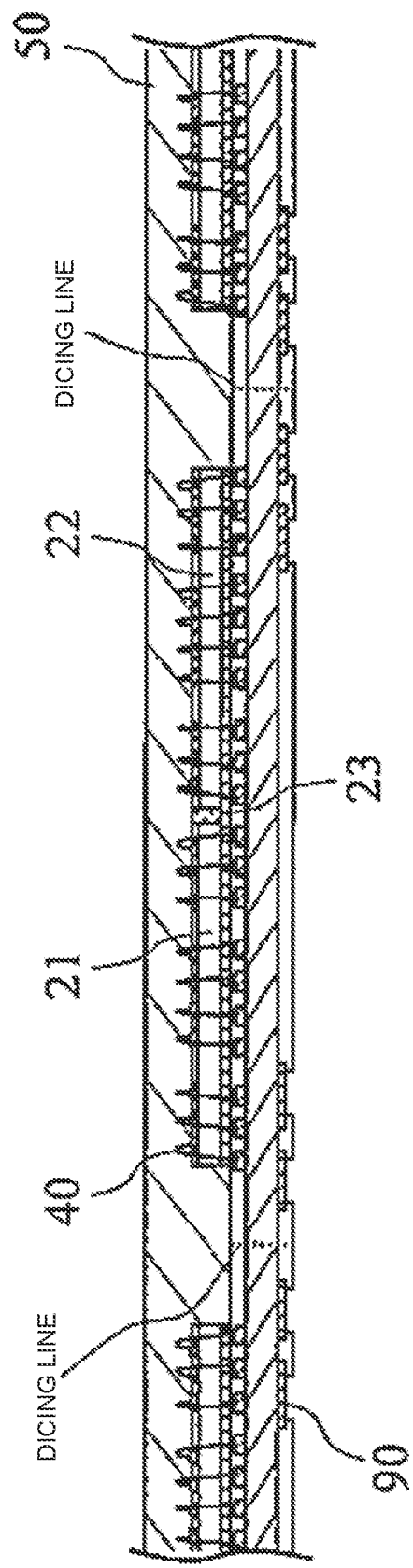

FIG. 7D depicts a process of sealing the wiring substrate 10, the first composite chip 20, and the wires 40 with resin. In this process, the wiring substrate 10, the first composite chip 20, and the conductive wires 40 are sealed so as to be covered with sealing resin, for example, thermosetting epoxy resin. The sealing resin forms the sealing resin layer 50 after curing by heat.

Since the first semiconductor chip 21 and the second semiconductor chip 22 are connected to each other by the dicing area 23, there is no gap between the two semiconductor chips.

Therefore, in the semiconductor device according to the present invention, sealing can be made with resin without consideration of a filling ratio of the sealing resin, thereby allowing an improvement in manufacturing efficiency. Furthermore, with the gap between the semiconductor chips eliminated, warpage or twist of the semiconductor device can be reduced, thereby allowing inhibition of a defect in transportation of the semiconductor device after sealing with resin and a reduction in mounting accuracy of the solder balls.

Figure 7E:
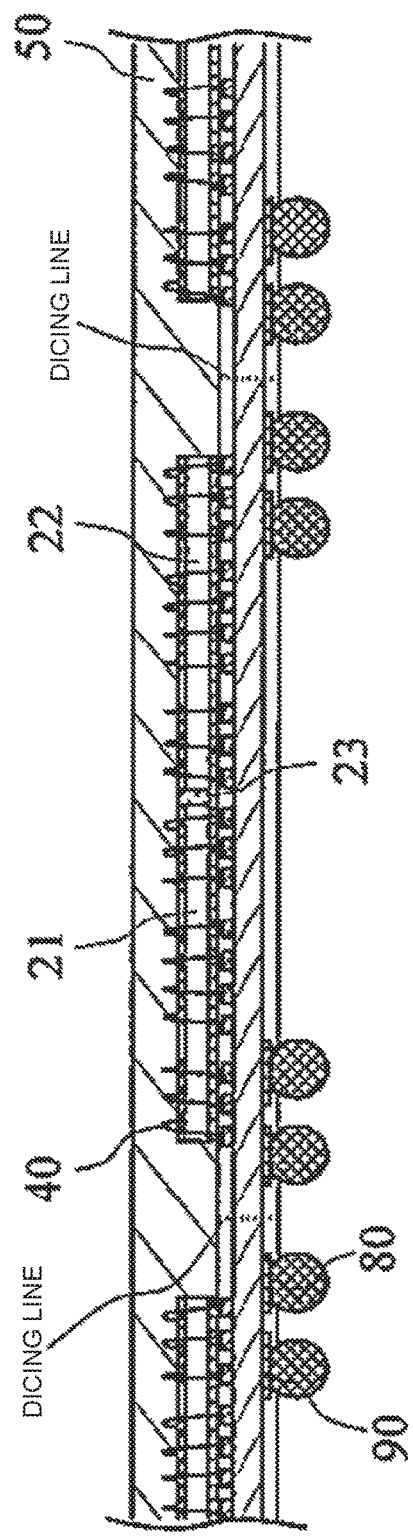

FIG. 7E depicts a process of mounting the solder balls 80. In this process, the solder balls 80 are mounted over the lands 90 by, for example, a solder ball mounter.

Figure 7F:
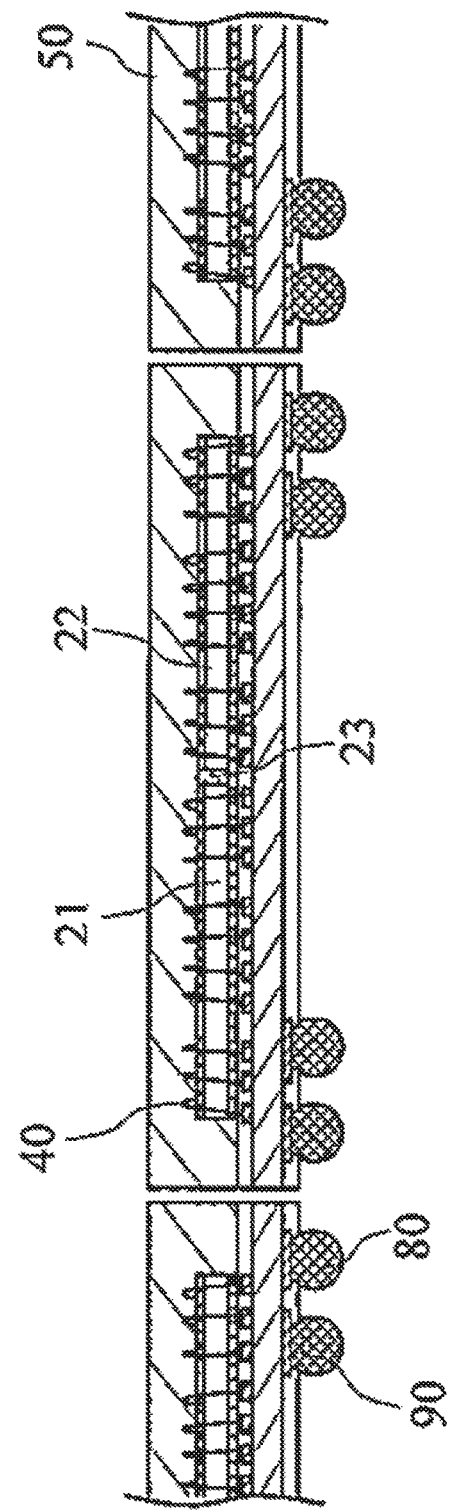

FIG. 7F depicts a process of dicing the semiconductor device. In this process, the semiconductor device is cut along the dicing lines by the dicing blade included in a dicing apparatus not depicted.

Second Embodiment

Figure 8:
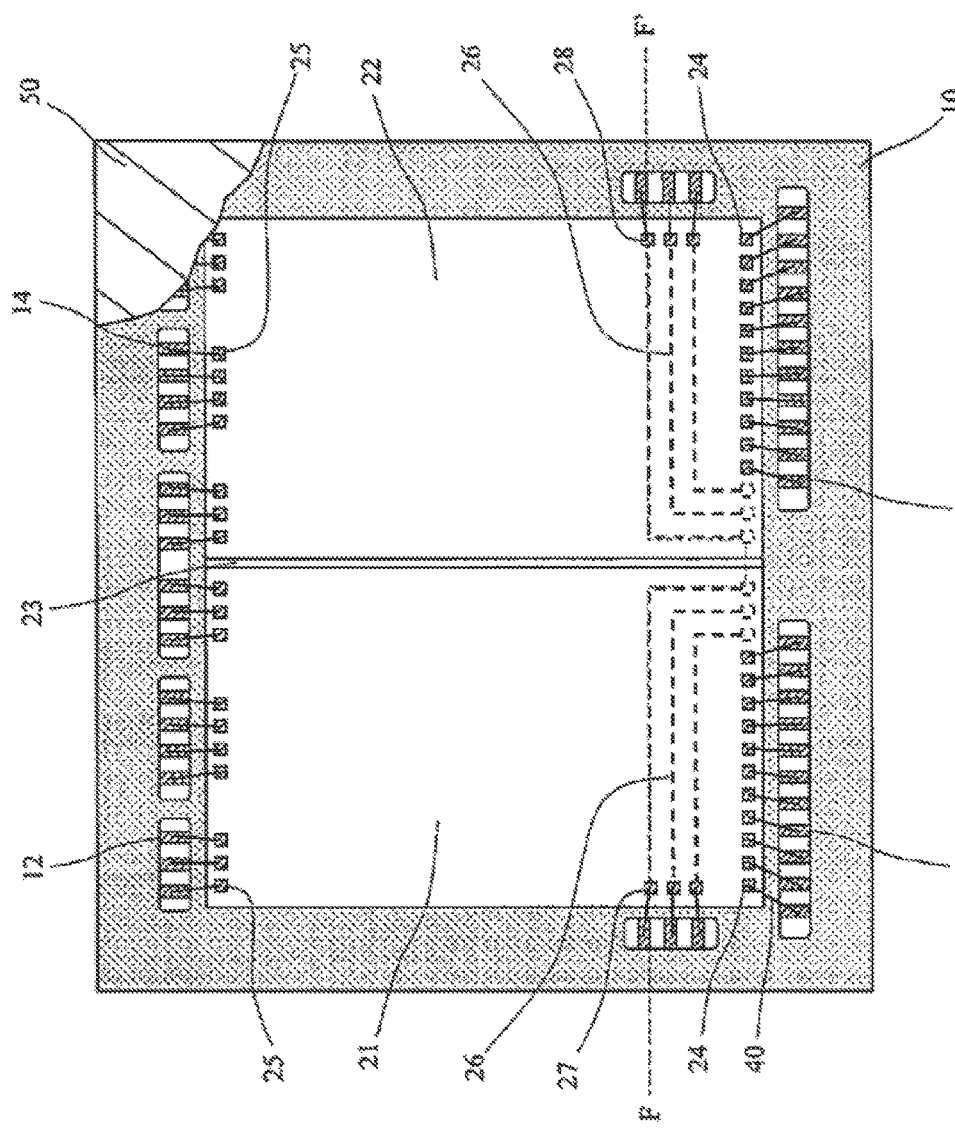
FIG. 8 is a plan view depicting the structure of a semiconductor device of a second embodiment according to the present invention.
Figure 9:
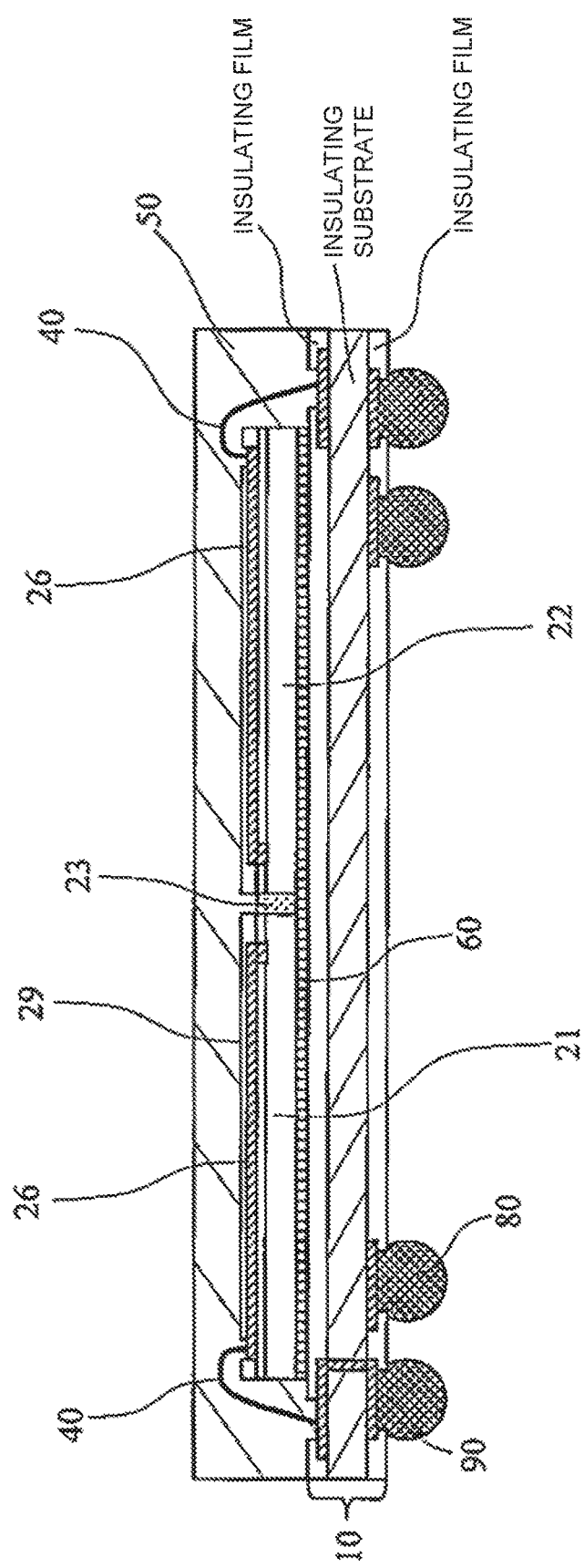
FIG. 9 is an F-F' sectional view of FIG. 8.

FIG. 8 is a plan view of a semiconductor device of a second embodiment according to the present invention, and FIG. 9 is an F-F' sectional view of the semiconductor device depicted in FIG. 8. In the following, with reference to FIG. 8 and FIG. 9 as appropriate, the semiconductor device of the second embodiment according to the present invention is described in detail.

With reference to FIG. 8, the semiconductor device of the second embodiment includes first rewiring pads 27 along a long side facing a dicing area 23 on one surface of a first semiconductor chip 21. Also, the semiconductor device includes second rewiring pads 28 along a long side facing the dicing area 23 on one surface of a second semiconductor chip 22. Furthermore, the semiconductor device of the second embodiment includes a RDL (Re-Distribution Layer) 26 on one surface of each of the first semiconductor chip 21 and the second semiconductor chip 22.

The first rewiring pads 27 are rewired by part of the first electrode pads 24 and the RDL (Redistribution wirings) 26 included in the first semiconductor chip 21. Similarly, the second rewiring pads 28 are rewired by part of the first electrode pads 24 and the RDL 26 of the second semiconductor chip 22.

With reference to FIG. 9, an insulating layer 29 is formed on the RDL 26 formed on each of the first semiconductor chip 21 and the second semiconductor chip 22. The insulating layer 29 insulates the RDL 26 from the surrounding for electrical protection.

Third Embodiment

Figure 10:
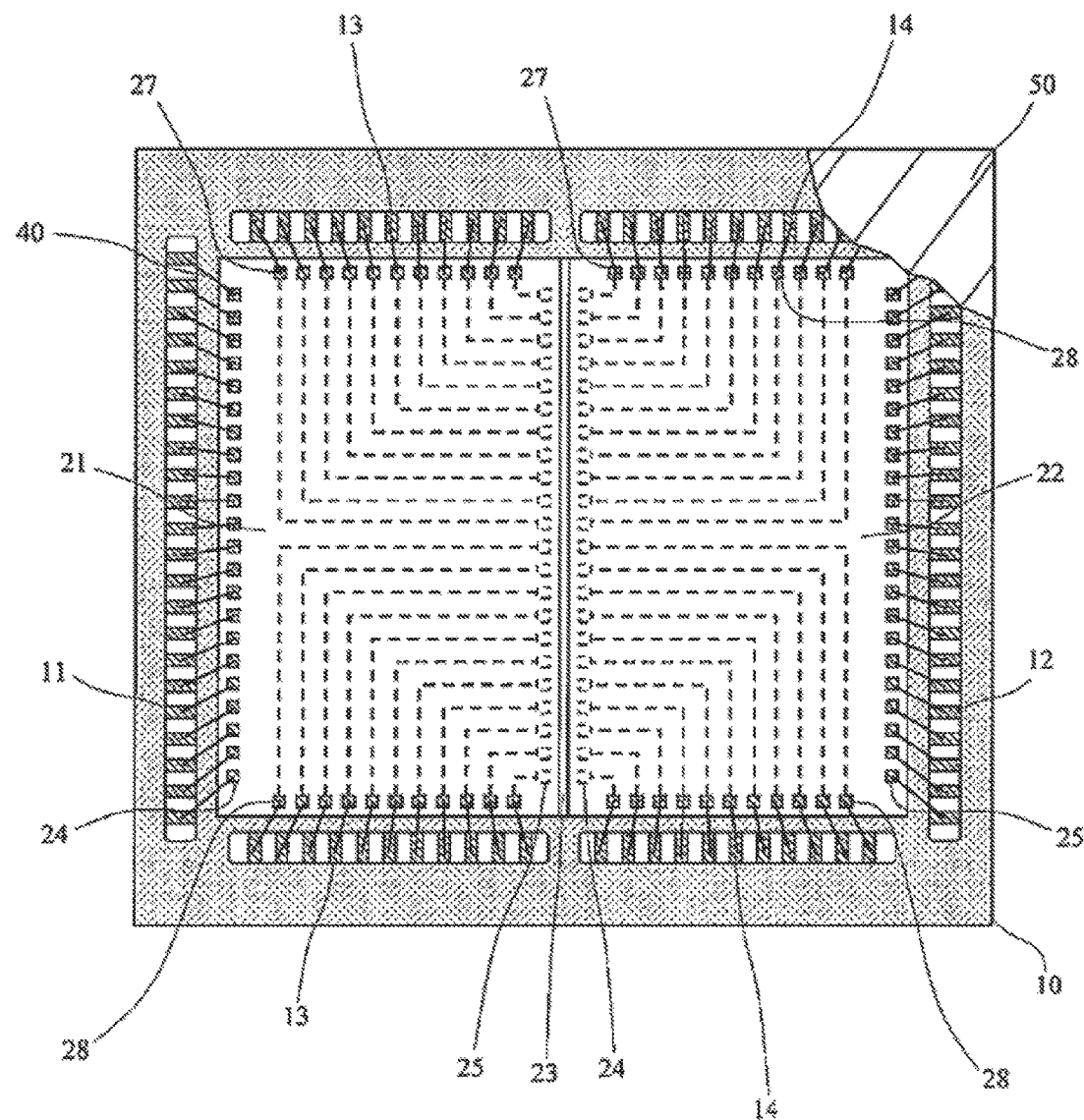
FIG. 10 is a plan view depicting the structure of a semiconductor device of a third embodiment according to the present invention.

FIG. 10 is a plan view depicting a semiconductor device of a third embodiment according to the present invention. In the following, with reference to FIG. 10 as appropriate, the semiconductor device of the third embodiment according to the present invention is described in detail.

With reference to FIG. 10, a first semiconductor chip 21 and a second semiconductor chip 22 includes first electrode pads 24 along one long side and second electrode pads 25 along the other long side. Also, the first semiconductor chip 21 and the second semiconductor chip 22 each include first rewiring pads 27 along one short side and second rewiring pads 28 along the other short side.

The second electrode pads 25 included in the first semiconductor chip 21 are electrically coupled to the first rewiring pads 27 and the second rewiring pads 28 included in the first semiconductor chip 21 by the RDL 26. Similarly, the first electrode pads 24 of the second semiconductor chip 22 are electrically coupled to the first rewiring pads 27 and the second rewiring pads 28 included in the second semiconductor chip 22 by the RDL 26.

As described above, the semiconductor device of the third embodiment allows connection between the wiring substrate 10 and the first composite chip 20 even when the first electrode pads 24 and the second electrode pads 25 are included on the long side facing the dicing area 23.

4. Fourth Embodiment

Figure 11:
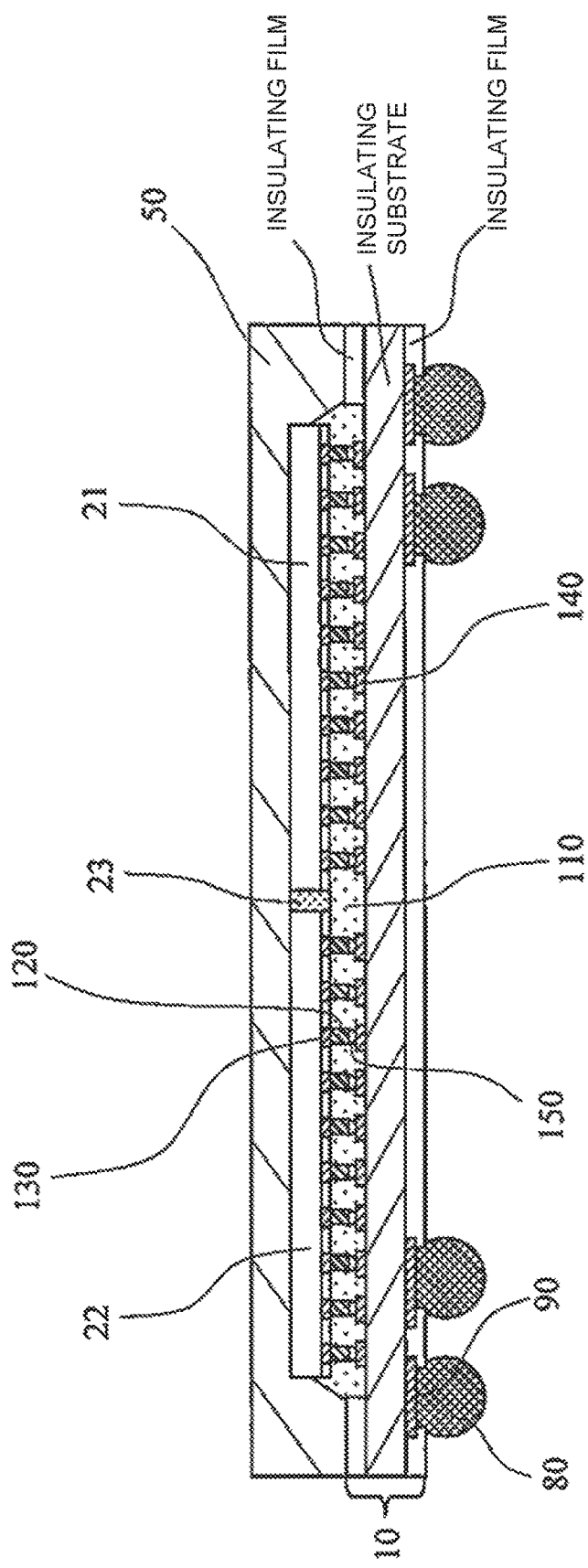
FIG. 11 is a plan view depicting the structure of a semiconductor device of a fourth embodiment according to the present invention.

FIG. 11 is a sectional view depicting a semiconductor device of a fourth embodiment according to the present invention. In the following, with reference to FIG. 11 as appropriate, the semiconductor device of the fourth embodiment according to the present invention is described in detail.

With reference to FIG. 11, a wiring substrate 10 includes bump connection pads 130 in place of the first to fourth connection pads 14, and a first composite chip 20 includes bump electrode pads 140 in place of an adhesive member 50.

In the semiconductor device of the fourth embodiment, the bump connection pads 130 and the bump electrode pads 140 are electrically coupled to each other by bumps 120. That is, the first composite chip 20 is not wire-bonded but flip-chip mounted onto the wiring substrate 10. Also, the bump electrode pads 140 are coated with solder, for example, solder paste, so that the first composite chip 20 can be efficiently flip-chip mounted on the wiring substrate 10. The solder with which the bump electrode pads 140 is coated forms a solder layer 150 after flip-chip mounting.

Furthermore, a space between the wiring substrate 10 and the first composite chip 20 is coated with a resin filler 110 which improves resin characteristics. The resin filler 110 is an insulator, and also plays a role of electrically protecting the bumps 120.

As described above, since the wiring substrate 10 and the first composite chip 20 are flip-chip mounted with solder in the semiconductor device of the fourth embodiment, the semiconductor device can be easily manufactured compared with wire bonding. Also, with the first composite chip 20 being flip-chip mounted on the wiring substrate 10 in the semiconductor device of the fourth embodiment, the thickness can be made thinner.

5. Fifth Embodiment

Figure 12:
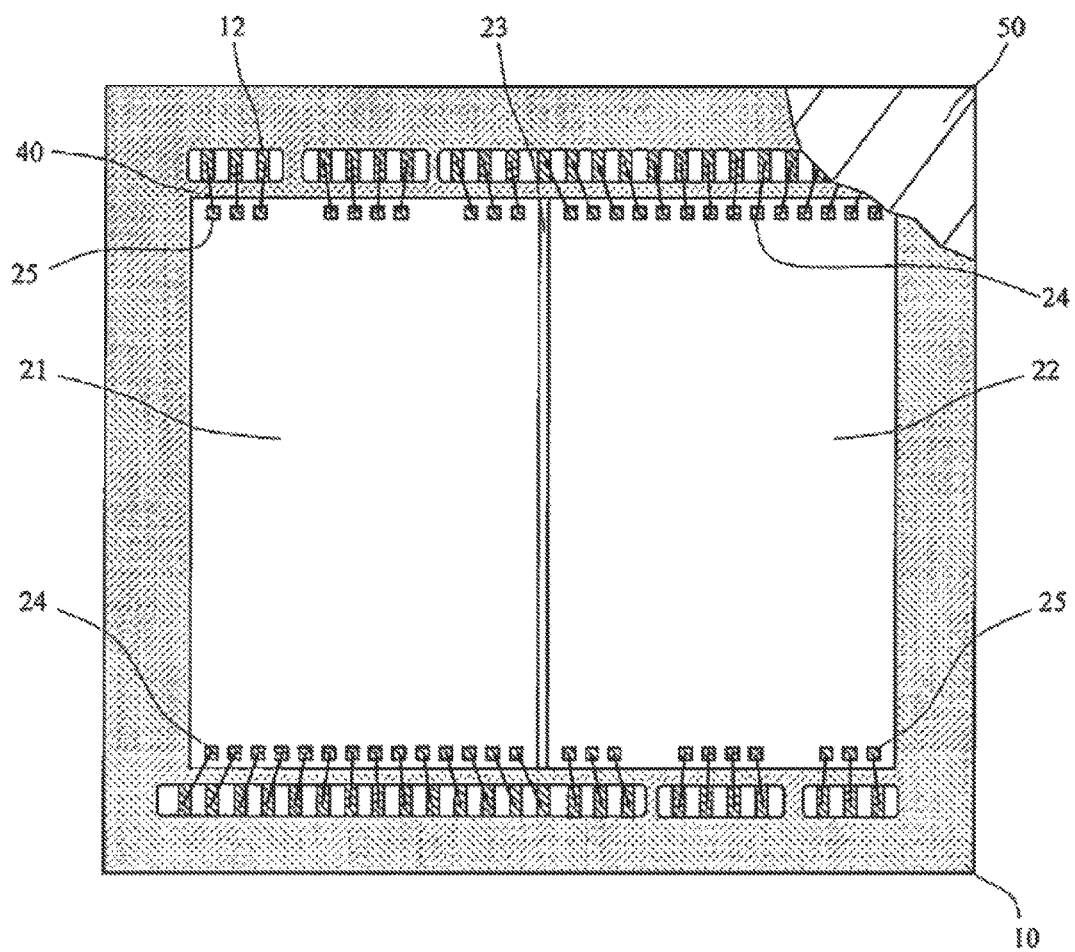
FIG. 12 is a plan view depicting the structure of a semiconductor device of a fifth embodiment according to the present invention.

FIG. 12 is a plan view depicting a semiconductor device of a fifth embodiment according to the present invention. In the following, with reference to FIG. 12 as appropriate, the semiconductor device of the fifth embodiment according to the present invention is described in detail.

With reference to FIG. 12, the semiconductor device of the fifth embodiment includes a first composite chip 20 having a first semiconductor chip 21 and a second semiconductor chip 22 connected opposite to each other by a dicing area 23.

The semiconductor device of the fifth embodiment is configured to have first electrode pads of the first semiconductor chip 21 and the second semiconductor chip 22 arranged to face each other. With the structure in which a large number of first electrode pads face each other, the arrangement of the connection pads on the wiring substrate 10 can be favorably configured, and also the size of the wiring substrate 10 can be reduced.

6. Sixth Embodiment

Figure 13:
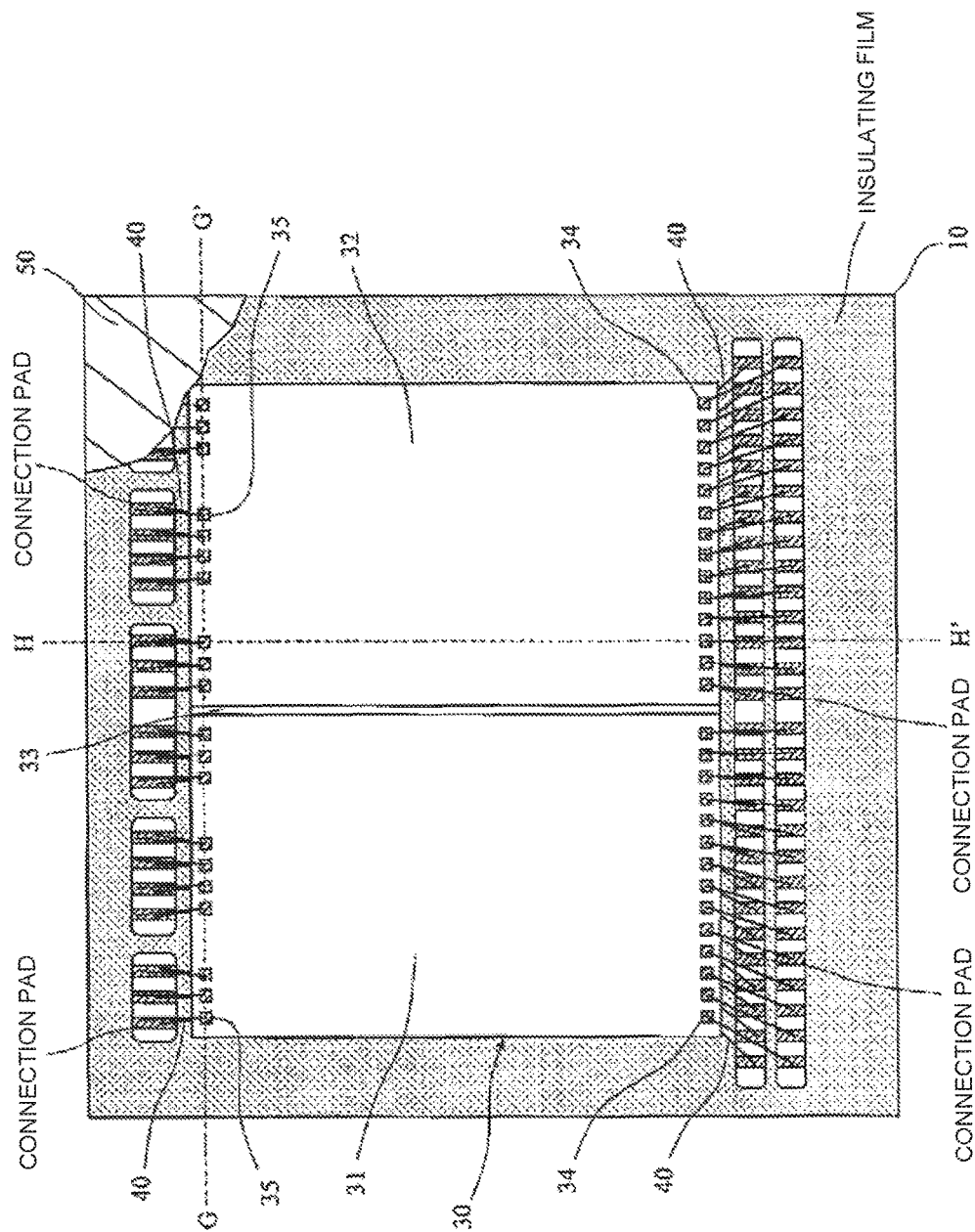
FIG. 13 is a plan view depicting the structure of a semiconductor device of a sixth embodiment according to the present invention.
Figure 14A:
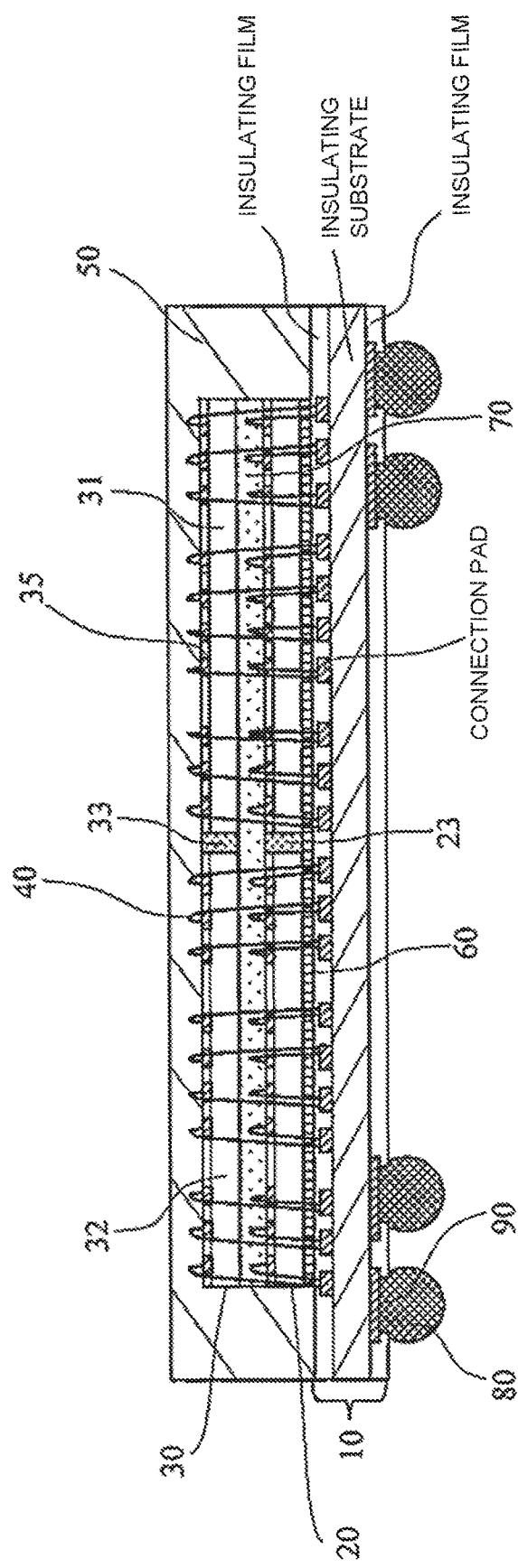
FIG. 14A is a G-G' sectional view of FIG. 13.
Figure 14B:
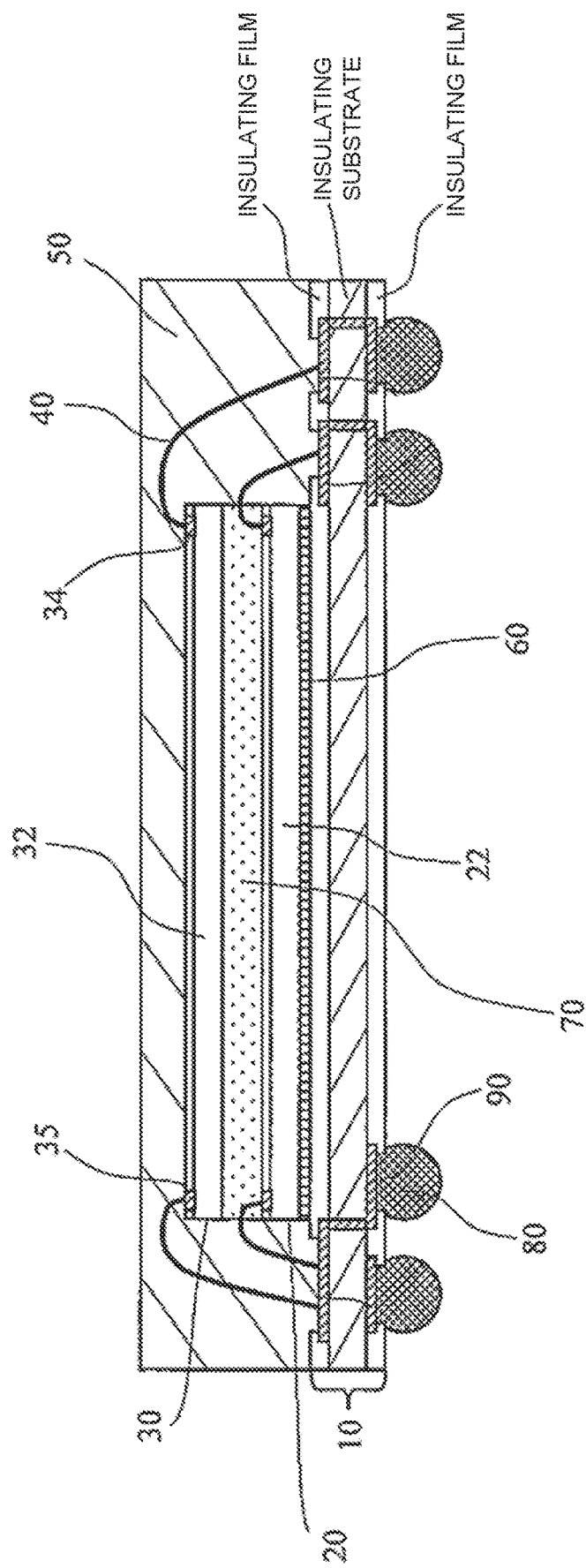
FIG. 14B is an H-H' sectional view of FIG. 13.

FIG. 13 is a plan view depicting a semiconductor device of a sixth embodiment according to the present invention. FIG. 14 is a sectional view depicting the semiconductor device of the sixth embodiment according to the present invention. In the following, with reference to FIG. 13 and FIG. 14 as appropriate, the semiconductor device of the sixth embodiment according to the present invention is described in detail.

With reference to FIG. 13 and FIG. 14, the semiconductor device of the sixth embodiment includes a wiring substrate 10, a first composite chip 20, and a second composite chip 30. The structure of connection between the wiring substrate 10 and the first composite chip 20 is similar to that of the semiconductor device of the first embodiment, and therefore description is omitted herein.

The second composite chip 30 is configured to have a third semiconductor chip 31 and a fourth semiconductor chip 32 connected to each other by a dicing area 33. The third semiconductor chip 31 and the fourth semiconductor chip 32 each include third electrode pads 34 and fourth electrode pads 35.

The second composite chip 30 is mounted over the first composite chip 20 by a second adhesive member 70 such as, for example, a FOW (Film On Wire). Here, the second adhesive member 70 is configured to be thicker than the first adhesive member 60, and is arranged so as to bury at least part of a plurality of wires for connecting the first composite chip 20 and the wiring substrate 10 to each other.

The second composite chip 30 has the third semiconductor chip 31 and the fourth semiconductor chip 32 mounted over the first composite chip 20 so as to be stacked over the first semiconductor chip 21 and the second semiconductor chip 22, respectively. Here, the second composite chip 30 may have the third semiconductor chip 31 mounted over the second semiconductor chip 22 and may have the fourth semiconductor chip 32 mounted over the first semiconductor chip 21. Also, while two composite chips are mounted in the semiconductor device of the sixth embodiment, this does not restrict the present invention and, for example, a composite chip may further be mounted over the second composite chip 30.

Electrical connection between the second composite chip 30 and the wiring substrate 10 is established by connecting the third electrode pads 34 and the fourth electrode pads 35 and respective connection pads included in the wiring substrate 10 corresponding thereto via wires 40. Also, the first composite chip 20, the second composite chip 30, and the plurality of wires 40 are configured to be entirely covered with a sealing resin layer 50.

Also in the semiconductor device of the sixth embodiment, the first composite chip 20 and the second composite chip 30 are configured so that the semiconductor chips are connected to each other by a dicing area. Therefore, as with the first embodiment, the size of the semiconductor device can be reduced without consideration of a filling ratio of resin. Furthermore, in the semiconductor device of the sixth embodiment, not only the size but also warpage and twist of the semiconductor device can be reduced. For example, in a semiconductor device in which the first semiconductor chip 21 and the second semiconductor chip 22 are arranged as being separated from each other and a third semiconductor chip 31 and a fourth semiconductor chip 32 are further mounted thereon, the risk of occurrence of a void is increased at the time of filling with resin. Moreover, in the above-structured semiconductor device, a step difference is increased every time a composite chip is mounted, and therefore the risk of occurrence of a void is further increased as the number of steps is increased. However, since the structure in the semiconductor device of the sixth embodiment is such that the semiconductor chips connected to each other by the dicing area are mounted as being stacked, a groove between the chips is eliminated. Therefore, in the semiconductor device of the sixth embodiment, the occurrence of a void due to a groove between the semiconductor chips can be reduced even if the number of semiconductor chips to be mounted is increased.

The present invention is not restricted to the embodiments described above, and it goes without saying that the present invention can be variously modified in a range not deviating from the gist of the present invention.

Some or all of the above embodiments can be described as in the following notes. Nevertheless, the present invention is not limited to those notes.

(Note 1)
A composite chip comprising a structure in which at least two semiconductor chips are mechanically-connected to each other by a dicing area.

(Note 2)
The composite chip as claimed in Note 1, wherein the structure is such that the two mechanically-connected semiconductor chips are stacked.

(Note 3)
A semiconductor device comprising: a wiring substrate; and a first semiconductor chip and a second semiconductor chip that are mounted over a same plane of the wiring substrate, the first semiconductor chip and the second semiconductor chip being mechanically-connected to each other by a dicing area to form a first composite chip.

(Note 4)
The semiconductor device as claimed in Note 3, wherein the first composite chip is covered with resin, and the resin forms a sealing resin layer over the wiring substrate.

(Note 5)
The semiconductor device as claimed in Note 3, further comprising: a third semiconductor chip and a fourth semiconductor chip provided over the first composite chip, and the third semiconductor chip and the fourth semiconductor chip are mechanically-connected to each other by a dicing area to form a second composite chip.

(Note 6)
The semiconductor device as claimed in Note 5, wherein the first composite chip and the second composite chip are covered with resin, and the resin forms a sealing resin layer over the wiring substrate.

(Note 7)
The semiconductor device as claimed in Note 3, wherein each of the first semiconductor chip and the second semiconductor chip is a semiconductor chip in a shape of a substantially rectangular plate and having a similar circuit configuration, and long sides of the first semiconductor chip and the second semiconductor chip face each other to be connected by the dicing area.

(Note 8)
The semiconductor device as claimed in Note 7, wherein a vertical distance between one short side of each of the first semiconductor chip and the second semiconductor chip and an edge of the wiring substrate facing the one short side is larger than a vertical distance between another short side of each of the first semiconductor chip and the second semiconductor chip and an edge of the wiring substrate facing the other short side.

(Note 9)
The semiconductor device as claimed in Note 3, wherein the wiring substrate has a plurality of first connection pads electrically coupled to a plurality of electrode pads of the first semiconductor chip and a plurality of second connection pads electrically coupled to a plurality of electrode pads of the second semiconductor chip, and a connection distance between the plurality of electrode pads and the plurality of second connection pads of the second semiconductor chip is larger than a connection distance between the plurality of electrode pads and the plurality of first connection pads of the first semiconductor chip.

(Note 10)
A semiconductor device comprising: a wiring substrate; and a composite chip including a plurality of semiconductor chips by a dicing area, the composite chip being mounted on the wiring substrate.

(Note 11)
The semiconductor device as claimed in Note 10, wherein a plurality of the composite chips are mounted on the wiring substrate, the composite chips are stacked each other.

(Note 12)
The semiconductor device as claimed in Note 10, wherein the composite chip is covered with resin, the resin forms a sealing resin layer on the wiring substrate.

(Note 13)
The semiconductor device as claimed in Note 10, wherein each of the plurality of semiconductor chips forming the composite chip is a semiconductor chip in a substantially rectangular shape and having a similar circuit configuration.

(Note 14)
A method of manufacturing a semiconductor device, the method comprising: cutting, from out of a semiconductor wafer where a plurality of semiconductor chips are formed, a first composite chip including a first semiconductor chip and a second semiconductor chip mechanically-connected to each other by a dicing area; and mounting the first composite chip over a wiring substrate.

(Note 15)
The method as claimed in Note 14, further comprising: forming a sealing resin layer over the wiring substrate so as to cover the first composite chip.

(Note 16)
The method as claimed in Note 14, further comprising: cutting, from out of the semiconductor wafer, a second composite chip including a third semiconductor chip and a fourth semiconductor chip mechanically-connected to each other by a dicing area; and stacking the second composite chip stacked over the first composite chip.

(Note 17)
The method as claimed in Note 16, further comprising: forming a sealing resin layer over the wiring substrate so as to cover the first and second composite chips.

(Note 18)
The method as claimed in Note 14, wherein each of the first semiconductor chip and the second semiconductor chip is a semiconductor chip in a shape of a substantially rectangular plate and having a similar circuit configuration, and long sides of the first semiconductor chip and the second semiconductor chip face each other to be connected by the dicing area.

(Note 19)
The method as claimed in Note 18, wherein the first semiconductor chip and the second semiconductor chip are mounted over the wiring substrate so that a vertical distance between one short side of each of the first semiconductor chip and the second semiconductor chip and an edge of the wiring substrate facing the one short side is larger than a vertical distance between another short side of each of the first semiconductor chip and the second semiconductor chip and an edge of the wiring substrate facing the other short side.

(Note 20)

The method as claimed in Note 14, wherein the wiring substrate has a plurality of first connection pads electrically coupled to a plurality of electrode pads of the first semiconductor chip and a plurality of second connection pads electrically coupled to a plurality of electrode pads of the second semiconductor chip, and a connection distance between the plurality of electrode pads and the plurality of second connection pads of the second semiconductor chip is larger than a connection distance between the plurality of electrode pads and the plurality of first connection pads of the first semiconductor chip.

We claim:

1. A semiconductor device comprising:
   a wiring substrate having first connection pads and second connection pads thereon; and
   a composite chip mounted over the wiring substrate, the composite chip including—
      a first area having a first memory circuit and a plurality of first electrode pads coupled to the first memory circuit, wherein the first electrode pads are coupled to the first connection pads,
      a second area having a second memory circuit and a plurality of second electrode pads coupled to the second memory circuit, wherein the second electrode pads are coupled to the second connection pads,
      a permanent third area having a first material between the first area and the second area, wherein the first area is spaced apart from the second area by the first material,
      a passivation film over the first and second areas so as to expose the first and second electrode pads,
      a rewiring pad formed on the passivation film in the first area,
      a redistribution wiring formed on the passivation film and coupled between an associated one of the first electrode pads and the rewiring pad, and
      an insulating layer over the passivation film and the redistribution wiring so as to expose the rewiring pad,
   wherein the first memory circuit and the second memory circuit are substantially free from electrically connecting to each other via the third area; and
   wherein the third area has a width in a range of 20 μm to 80 μm.

2. The semiconductor device as claimed in claim 1 wherein the composite chip is a first composite chip, the semiconductor device further comprising:
   a second composite chip stacked over the first composite chip, the second composite chip including—
      a fourth area having a third memory unit,
      a fifth area having a fourth memory unit, and
      a sixth area having a second material between the fourth and fifth areas, wherein the fourth area is spaced apart from the fifth area by the second material,
      wherein the third and fourth circuits are substantially free from electrically connecting to each other via the sixth area.

3. The semiconductor device of claim 2, further comprising a third material between the first and second composite chips, wherein the third material extends continuously over a surface of the second composite chip.

4. The semiconductor device of claim 3 wherein the third material is an adhesive material and differs from the first and second materials.

5. The semiconductor device as claimed in claim 1 wherein each of the first and second connection pads is coupled to an associated one of the first and second electrode pads via a wire or a bump electrode.

6. The semiconductor device as claimed in claim 1 wherein the composite chip includes a plurality of first rewiring pads formed on the first area and a plurality of second rewiring pads formed on the second area, wherein the first rewiring pads are coupled to the first electrode pads, and the second rewiring pads are coupled to the second electrode pads.

7. The semiconductor device as claimed in claim 1 wherein the second memory circuit is identical to the first memory circuit.

8. The semiconductor device of claim 1, further comprising a mold material over the wiring substrate and at least partially covering the composite chip.

9. The semiconductor device of claim 1 wherein the first area includes a first sidewall facing a first direction and the second area includes a second sidewall facing a second direction generally opposite the first direction, and wherein the first material contacts the first sidewall and the second sidewall.

10. The semiconductor device of claim 1, further comprising a die-attach material between the composite chip and the wiring substrate, wherein the die-attach material extends continuously over a surface of the first area and a surface of the second area.

11. The semiconductor device of claim 10 wherein the die-attach material extends vertically between the composite chip and the wiring substrate such that the composite chip is separated from the wiring substrate by the die-attach material.

12. A semiconductor device comprising:
   a composite chip including a first area, a second area, a permanent third area laterally between the first and second areas, a first memory circuit formed in the first area, a plurality of first electrode pads coupled to the first memory circuit, a second memory circuit formed in the second area, a plurality of second electrode pads coupled to the second memory circuit, and a passivation film selectively formed over the first area and the second area such that the first and second electrode pads are at least partially exposed, wherein the third area has a width in a range of 20 μm to 80 μm;
   a plurality of first rewiring pads over the passivation film in the first area, each of the first rewiring pads being coupled to an associated one of the first electrode pads; and
   a plurality of first redistribution wirings, each of the plurality of first redistribution wirings extending from an associated one of the first electrode pads to an associated one of the first rewiring pads;
   a plurality of second rewiring pads formed over the passivation film in the second area, each of the second rewiring pads being coupled to an associated one of the second electrode pads;
   a plurality of second redistribution wirings, each of the plurality of second redistribution wirings extending from an associated one of the second electrode pads to an associated one of the second rewiring pads; and an insulating layer formed over the passivation film, the first redistribution wirings and the second redistribution wirings such that the first and second rewiring pads are at least partially exposed.

13. The semiconductor device as claimed in claim 12 wherein the second memory circuit is identical to the first memory circuit.

* * * * *